(12) United States Patent
Kim

(10) Patent No.: US 10,679,682 B2
(45) Date of Patent: Jun. 9, 2020

(54) SEMICONDUCTOR DEVICES

(71) Applicant: SK hynix Inc., Icheon-si, Gyeonggi-do (KR)

(72) Inventor: Woongrae Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/198,264

(22) Filed: Nov. 21, 2018

(65) Prior Publication Data

US 2020/0020369 A1 Jan. 16, 2020

(30) Foreign Application Priority Data

Jul. 16, 2018 (KR) .................. 10-2018-0082453

(51) Int. Cl.
*G11C 7/10* (2006.01)
*G11C 7/22* (2006.01)

(52) U.S. Cl.
CPC .......... *G11C 7/1087* (2013.01); *G11C 7/1006* (2013.01); *G11C 7/22* (2013.01)

(58) Field of Classification Search
CPC ........ G11C 7/1087; G11C 7/1006; G11C 7/22
USPC .................................................. 365/189.05
See application file for complete search history.

(56) References Cited

U.S. PATENT DOCUMENTS

| | | | |
|---|---|---|---|
| 5,734,849 A | 3/1998 | Butcher | |
| 5,841,731 A * | 11/1998 | Shinozaki | G11C 7/1045 365/233.1 |
| 6,763,416 B1 * | 7/2004 | LaBerge | G06F 13/1689 710/305 |
| 6,804,165 B2 * | 10/2004 | Schrogmeier | G11C 7/1072 365/189.07 |
| 6,894,945 B2 * | 5/2005 | Sawada | G11C 7/1066 365/189.05 |
| 7,013,374 B2 * | 3/2006 | Jakobs | G11C 7/1006 711/167 |
| 7,333,908 B2 * | 2/2008 | Johnson | G01R 31/31716 702/107 |
| 7,940,543 B2 * | 5/2011 | Chang | G11C 8/06 365/189.05 |
| 8,321,779 B2 * | 11/2012 | Shin | H03M 13/091 714/746 |
| 10,249,351 B2 * | 4/2019 | Kang | G11C 16/10 |
| 2002/0003747 A1 * | 1/2002 | Yahata | G11C 7/1066 365/233.1 |
| 2014/0063977 A1 * | 3/2014 | Park | G11C 7/1087 365/189.05 |

FOREIGN PATENT DOCUMENTS

KR 1020170088138 A 8/2017

* cited by examiner

*Primary Examiner* — Viet Q Nguyen
(74) *Attorney, Agent, or Firm* — William Park & Associates Ltd.

(57) ABSTRACT

A semiconductor device includes a latch data generation circuit and a column path circuit. The latch data generation circuit extracts pattern data from external signals and generates latched data from the extracted pattern data, when the semiconductor device enters a pattern input mode. The column path circuit stores the latched data when a write command is inputted in the pattern input mode and generates mode data from the latched data stored in the column path circuit after a write latency elapses from a point of time that the write command is inputted.

21 Claims, 17 Drawing Sheets

FIG.5

| COMMAND | CS | CLOCK EDGE | CA<1> | CA<2> | CA<3> | CA<4> | CA<5> | CA<6> | CA<7> |
|---------|----|----|-------|-------|-------|-------|-------|-------|-------|
| CASF | H | CLKr | L | L | H | H | WS_WR | WS_RD | WS_FS |
|  | X | CLKf | DC<1> | DC<2> | DC<3> | DC<4> | CAS_WRX | V | B3 |

FIG.13

|    | PD<1> | PD<2> | PD<3> | PD<4> |
|----|-------|-------|-------|-------|
| 0  | 0     | 0     | 0     | 0     |
| 1  | 0     | 0     | 0     | 1     |
| 2  | 0     | 0     | 1     | 0     |
| 3  | 0     | 0     | 1     | 1     |
| 4  | 0     | 1     | 0     | 0     |
| 5  | 0     | 1     | 0     | 1     |
| 6  | 0     | 1     | 1     | 0     |
| 7  | 0     | 1     | 1     | 1     |
| 8  | 1     | 0     | 0     | 0     |
| 9  | 1     | 0     | 0     | 1     |
| 10 | 1     | 0     | 1     | 0     |
| 11 | 1     | 0     | 1     | 1     |
| 12 | 1     | 1     | 0     | 0     |
| 13 | 1     | 1     | 0     | 1     |
| 14 | 1     | 1     | 1     | 0     |
| 15 | 1     | 1     | 1     | 1     |

SEMICONDUCTOR DEVICES

CROSS-REFERENCE TO RELATED APPLICATIONS

The present application claims priority under 35 U.S.C 119(a) to Korean Application No. 10-2018-0082453, filed on Jul. 16, 2018, which is incorporated herein by reference in its entirety.

BACKGROUND

1. Technical Field

Various embodiments of the present disclosure generally relate to semiconductor devices performing a column operation.

2. Related Art

In general, a semiconductor device such as a dynamic random access memory (DRAM) device may include a plurality of bank groups comprised of cell arrays which are selected by addresses. Each of the bank groups may be realized to include a plurality of banks. The semiconductor device may select any one of the plurality of bank groups and may perform a column operation for outputting data stored in a cell array included in the selected bank group through input/output I/O lines.

SUMMARY

According to an embodiment, a semiconductor device includes a latch data generation circuit and a column path circuit. The latch data generation circuit extracts pattern data from external signals and generates latched data from the extracted pattern data, when the semiconductor device enters a pattern input mode. The column path circuit stores the latched data when a write command is inputted in the pattern input mode and generates mode data from the latched data stored in the column path circuit after a write latency elapses from a point of time that the write command is inputted.

According to an embodiment, a semiconductor device includes a latch data generation circuit and a column path circuit. The latch data generation circuit generates first latched data from first pattern data when the semiconductor device enters a first pattern input mode in which the first pattern data having a first logic level combination are inputted. The column path circuit stores the first latched data when a first write command is inputted in the first pattern input mode and generates first mode data from the first latched data stored in the column path circuit after a write latency elapses from a point of time that the first write command is inputted.

According to an embodiment, a semiconductor device includes a latch data generation circuit and a column path circuit. The latch data generation circuit extracts pattern data from external signals and generates latched data from the extracted pattern data, when the semiconductor device enters a pattern input mode. The column path circuit stores the latched data when a first write command is inputted in the pattern input mode and generates first mode data from the latched data stored in the column path circuit after a write latency elapses from a point of time that the first write command is inputted. The column path circuit stores the latched data when a second write command is inputted during a period corresponding to the write latency after the first write command is inputted and generates second mode data from the latched data stored in the column path circuit after the write latency elapses from a point of time that the second write command is inputted.

BRIEF DESCRIPTION OF THE DRAWINGS

FIG. 5 is a table illustrating an operation of the mode control circuit illustrated in FIG. 3 and an operation of the latch data generation circuit illustrated in FIG. 4.

FIGS. 13 and 14 are tables illustrating an operation of the data decoder illustrated in FIGS. 11 and 12.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
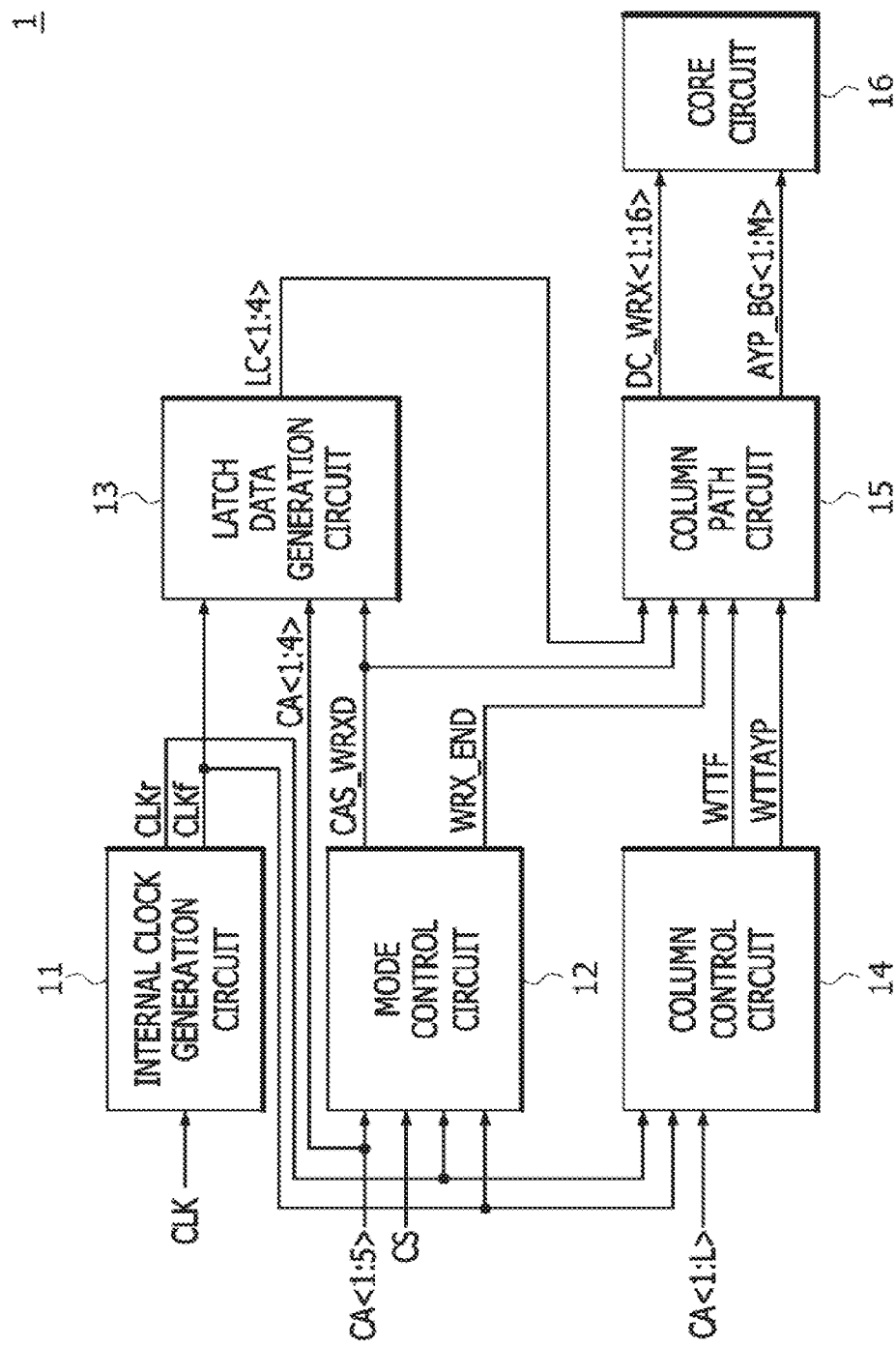
FIG. 1 is a block diagram illustrating a configuration of a semiconductor device according to an embodiment of the present disclosure.

As illustrated in FIG. 1, a semiconductor device 1 according to an embodiment may include an internal dock generation circuit 11, a mode control circuit 12, a latch data generation circuit 13, a column control circuit 14, a column path circuit 15, and a core circuit 16.

The internal clock generation circuit 11 may generate a first internal clock signal CLKr and a second internal clock signal CLKf from a clock signal CLK. The internal clock generation circuit 11 may buffer the clock signal CLK to generate the first internal clock signal CLKr and may inversely buffer the clock signal CLK to generate the second internal clock signal CLKf. The first internal clock signal CLKr may be generated to have the same phase as the clock signal CLK, and the second internal clock signal CLKf may be generated to have an opposite phase to the clock signal CLK. An operation of the internal clock generation circuit 11 will be described with reference to FIG. 2 later.

The mode control circuit 12 may generate a delay mode signal CAS_WRXD and a delay mode output control signal WRX_END from first to fifth external signals CA<1:5> in response to the first internal clock signal CLKr, the second internal clock signal CLKf, and a chip selection signal CS. The external signals may include a command and an address. The mode control circuit 12 may decode the first to fourth external signals CA<1:4> inputted in synchronization with the chip selection signal CS and the first internal clock signal CLKr to generate a decoded command (CASd of FIG. 3) and may latch the decoded command (CASd of FIG. 3) in synchronization with the second internal clock signal CLKf to generate a mode command (CASF of FIG. 3) for putting the semiconductor device 1 in various modes including a pattern input mode. In the pattern input mode, first to sixteenth mode data DC_WRX<1:16> generated by decoding first to fourth latched data LC<1:4> may be stored into the core circuit 16. The mode control circuit 12 may generate a mode signal (CAS_WRX of FIG. 3) for putting the semiconductor device 1 in the pattern input mode according to a logic level of the fifth external signal CA<5> which is inputted in synchronization with the second internal clock signal CLKf while the mode command (CASF of FIG. 3) is generated. The mode control circuit 12 may delay the mode signal (CAS_WRX of FIG. 3) to generate the delay mode signal CAS_WRXD. The delay mode signal CAS_WRXD may be generated to latch the first to fourth latched data LC<1:4> in a pipe latch (63 of FIG. 8) included in the column path circuit 15. The mode control circuit 12 may generate a mode output control signal (WRX_EN of FIG. 3) if both of the mode command (CASF of FIG. 3) and the mode signal (CAS_WRX of FIG. 3) are generated. The mode control circuit 12 may shift the mode output control signal (WRX_EN of FIG. 3) by a write latency to generate the delay mode output control signal WRX_END. The delay mode output control signal WRX_END may be generated to output the first to fourth latched data LC<1:4> which are latched by the pipe latch (63 of FIG. 8). The chip selection signal CS may be generated to have a predetermined logic level in order to select a chip including the semiconductor device 1. The number of bits included in the external signals for generating the delay mode signal CAS_WRXD and the delay mode output control signal WRX_END may be set to be different according to the embodiments. An operation of the mode control circuit 12 will be described with reference to FIGS. 3 and 5 later.

The latch data generation circuit 13 may generate the first to fourth latched data LC<1:4> from the first to fourth external signals CA<1:4> in response to the second internal clock signal CLKf and the delay mode signal CAS_WRXD. The latch data generation circuit 13 may generate the first to fourth latched data LC<1:4> which are used in the pattern input mode. The latch data generation circuit 13 may receive the first to fourth external signals CA<1:4> in synchronization with the second internal clock signal CLKf and may latch the first to fourth external signals CA<1:4> in synchronization with the delay mode signal CAS_WRXD to generate the first to fourth latched data LC<1:4>. The number of bits included in the external signals inputted to the latch data generation circuit 13 and the number of bits included in the latched data generated by the latch data generation circuit 13 may be set to be different according to the embodiments. A configuration and an operation of the latch data generation circuit 13 will be described with reference to FIGS. 4 and 5 later.

The column control circuit 14 may generate a write flag WTTF and a column control pulse WTTAYP from first to $L^{th}$ external signals CA<1:L> in response to the first internal clock signal CLKr and the second internal clock signal CLKf, if the number of bits included in the external signals is 'L' (where, 'L' denotes a natural number). The column control circuit 14 may generate a write signal (EWT of FIG. 6) for performing a write operation according to a logic level combination of the first to $L^{th}$ external signals CA<1:L> inputted in response to the first internal clock signal CLKr and the second internal clock signal CLKf. The column control circuit 14 may delay the write signal (EWT of FIG. 6) to generate the write flag WTTF and the column control pulse WTTAYP. The column control circuit 14 may delay the write signal (EWT of FIG. 6) by a period corresponding to the write latency to generate the write flag WTTF and the column control pulse WTTAYP. A delay time of the write signal (EWT of FIG. 6) for generating the write flag WTTF and the column control pulse WTTAYP in the column control circuit 14 may be set to be different according to the embodiments. The number of bits included in the external signals for generating the write flag WTTF and the column control pulse WTTAYP may be set to be different according to the embodiments. A configuration and an operation of the column control circuit 14 will be described with reference to FIG. 6 later.

The column path circuit 15 may generate the first to sixteenth mode data DC_WRX<1:16> from the first to fourth latched data LC<1:4> in response to the delay mode signal CAS_WRXD, the delay mode output control signal WRX_END, and the write flag WTTF. The column path circuit 15 may store the first to fourth latched data LC<1:4> into the pipe latch (63 of FIG. 8) of the column path circuit 15 in response to the delay mode signal CAS_WRXD. In an embodiment, the column path circuit 15 may store the first to fourth latched data LC<1:4> into the pipe latch (63 of FIG. 8) of the column path circuit 15 when a write command (WR of FIG. 16) is inputted through the external signals CA<1:L> in the pattern input mode. The column path circuit 15 may output the first to fourth latched data LC<1:4> stored in the pipe latch (63 of FIG. 8) as first to fourth pipe data (PD<1:4> of FIG. 8) in response to the delay mode output control signal WRX_END and the write flag WTTF. In an embodiment, the column path circuit 15 may output the first to fourth latched data LC<1:4> stored in the pipe latch (63 of FIG. 8) as first to fourth pipe data (PD<1:4> of FIG. 8) after a write latency elapses from a point of time that the write command (WR of FIG. 16) is inputted through the external signals CA<1:L>. The column path circuit 15 may decode the first to fourth pipe data (PD<1:4> of FIG. 8) to generate the first to sixteenth mode data DC_WRX<1:16>. The number of bits included in the latched data and the number of bits included in the mode data may be set to be different according to the embodiments. The column path circuit 15 may generate first to $M^{th}$ column bank group addresses AYP_BG<1:M> from the first to $L^{th}$ external signals CA<1:L> in response to the first internal dock signal CLKr and the second internal dock signal CLKf if the write flag WTTF and the column control pulse WTTAYP are generated. The first to $M^{th}$ column bank group addresses AYP_BG<1:M> may have a logic level combination for selecting a cell array included in the core circuit 16 in which the first to sixteenth mode data DC_WRX<1:16> are stored in the pattern input mode. The first to $M^{th}$ column bank group addresses AYP_BG<1:M> may include information on bank groups, banks, and column paths which are included in the core circuit 16. The number TV of bits included in the first to $M^{th}$ column bank group addresses AYP_BG<1:M> may be set to be different according to the embodiments. A configuration and an operation of the column path circuit 15 will be described with reference to FIGS. 7 to 14 later.

Figure 2:
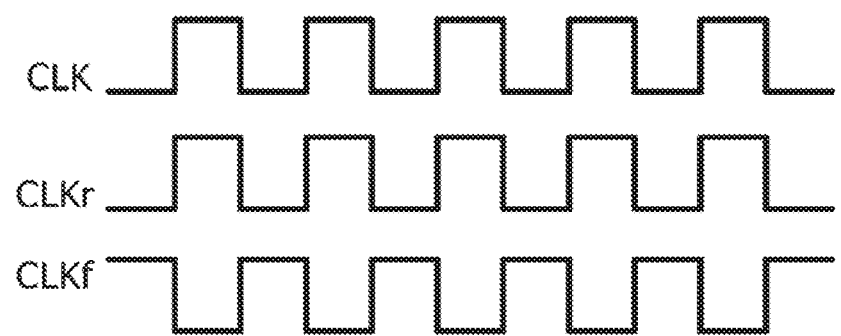
FIG. 2 is a timing diagram illustrating an operation of an internal clock generation circuit included in the semiconductor device of FIG. 1.

Referring to FIG. 2, the first internal clock signal CLKr and the second internal clock signal CLKf generated from the clock signal CLK in the internal clock generation circuit 11 are illustrated. The first internal clock signal CLKr may be generated to have the same phase as the clock signal CLK, and the second internal clock signal CLKf may be generated to have an opposite phase to the clock signal CLK.

Figure 3:
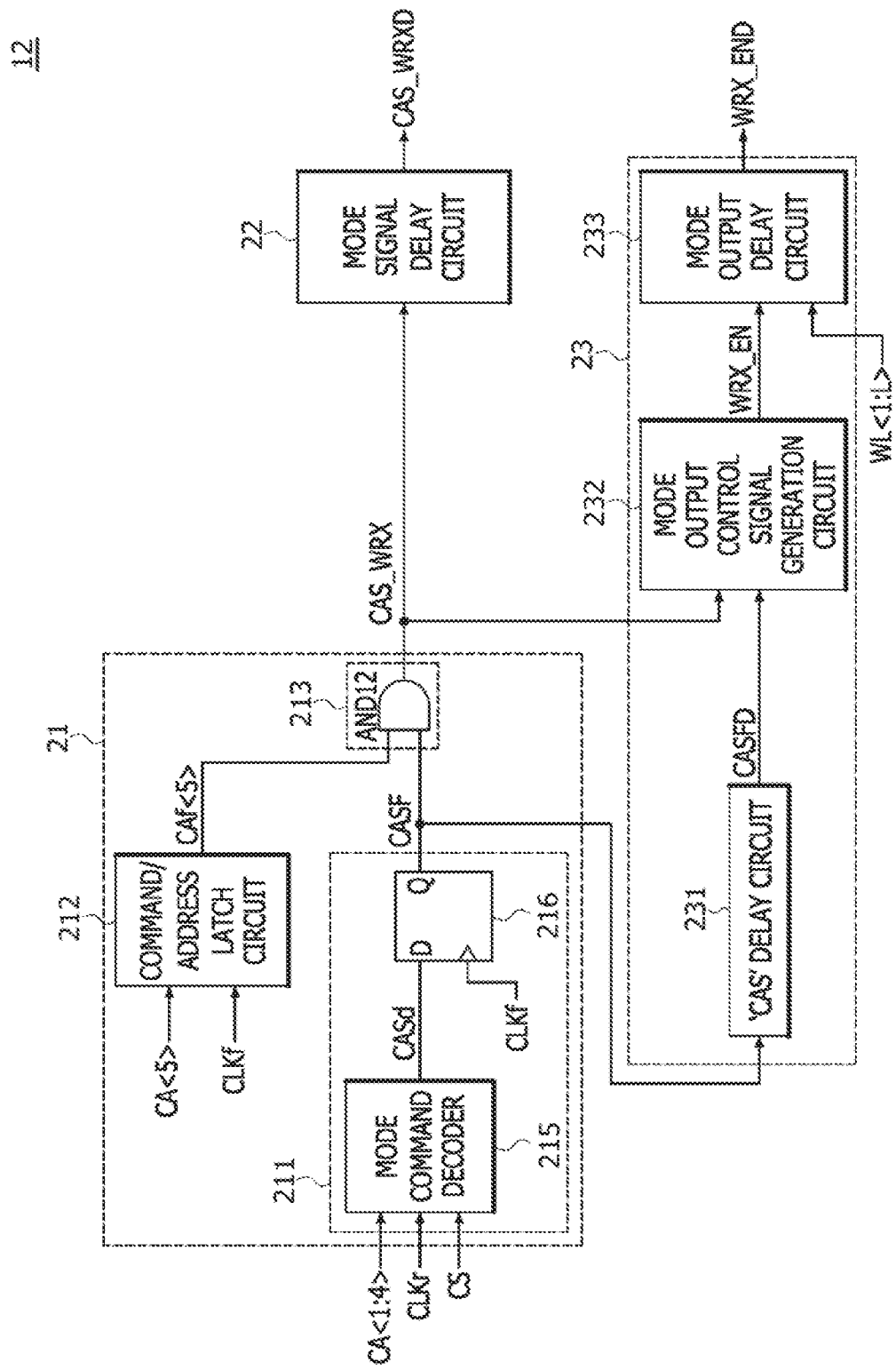
FIG. 3 is a block diagram illustrating a configuration of a mode control circuit included in the semiconductor device of FIG. 1.

As illustrated in FIG. 3, the mode control circuit 12 may include a mode entry control circuit 21, a mode signal delay circuit 22, and a mode output control circuit 23.

The mode entry control circuit 21 may include a mode command generation circuit 211, a command/address latch circuit 212, and a mode signal generation circuit 213. The mode command generation circuit 211 may include a mode command decoder 215 and a mode command output circuit 216. The mode command decoder 215 may decode the first to fourth external signals CA<1:4> inputted in synchronization with the chip selection signal CS and the first internal clock signal CLKr to generate the decoded command CASd. The mode command decoder 215 may generate the decoded command CASd if the first to fourth external signals CA<1:4> having a predetermined logic level combination are inputted to the mode command decoder 215 in synchronization with a rising edge of the first internal clock signal CLKr while the chip selection signal CS has a logic "high" level. The mode command output circuit 216 may latch the decoded command CASd in synchronization with a rising edge of the second internal clock signal CLKf and may generate the mode command CASF from the latched command of the decoded command CASd. The mode command output circuit 216 may be realized using a D-flipflop. The command/address latch circuit 212 may generate a latched external signal CAf<5> from the fifth external signal CA<5> in response to the second internal clock signal CLKf. The command/address latch circuit 212 may latch the fifth external signal CA<5> in synchronization with a rising edge of the second internal clock signal CLKf and may output the latched signal of the fifth external CA<5> as the latched external signal CAf<5>. The command/address latch circuit 212 may generate the latched external signal CAf<5> having a logic "high" level if the fifth external signal CA<5> having a logic "high" level is inputted to the command/address latch circuit 212 in synchronization with a rising edge of the second internal clock signal CLKf. The command/address latch circuit 212 may be realized using a D-flipflop. The mode signal generation circuit 213 may include an AND gate AND12 that performs a logical AND operation of the latched external signal CAf<5> and the mode command CASF to generate the mode signal CAS_WRX. The mode signal generation circuit 213 may generate the mode signal CAS_WRX having a logic "high" level if both of the latched external signal CAf<5> and the mode command CASF have a logic "high" level.

The mode entry control circuit 21 may generate the mode command CASF for entering various modes including the pattern input mode if the first to fourth external signals CA<1:4> having a predetermined logic level combination is inputted to the mode entry control circuit 21 in synchronization with a rising edge of the first internal clock signal CLKr while the chip selection signal CS has a logic "high" level. The mode entry control circuit 21 may generate the mode signal CAS_WRX for entering the pattern input mode if the fifth external signal CA<5> having a logic "high" level is inputted to the mode entry control circuit 21 in synchronization with the second internal clock signal CLKf while the mode command CASF is generated.

The mode signal delay circuit 22 may delay the mode signal CAS_WRX to generate the delay mode signal CAS_WRXD. The delay mode signal CAS_WRXD may be generated to latch the first to fourth latched data LC<1:4> in the pipe latch (63 of FIG. 8). A delay time of the mode signal CAS_WRXD in the mode signal delay circuit 22 may be set to be different according to the embodiments.

The mode output control circuit 23 may include a column address strobe (CAS) delay circuit 231, a mode output control signal generation circuit 232, and a mode output delay circuit 233. The 'CAS' delay circuit 231 may delay the mode command CASF to generate a delayed mode command CASFD. A delay time of the mode command CASF in the 'CAS' delay circuit 231 may be set to be different according to the embodiments. The mode output control signal generation circuit 232 may generate the mode output control signal WRX_EN if both of the delayed mode command CASFD and the mode signal CAS_WRX are generated. The mode output delay circuit 233 may delay the mode output control signal WRX_EN in response to a write latency signal WL<1:L> to generate the delay mode output control signal WRX_END. The write latency signal WL<1:L> may have a logic level combination corresponding to a write latency of the semiconductor device 1. The mode output delay circuit 233 may shift the mode output control signal WRX_EN by the write latency corresponding to the write latency signal WL<1:L> to generate the delay mode output control signal WRX_END.

As described above, the mode output control circuit 23 may shift the mode output control signal WRX_EN, which is generated if both of the mode command CASF and the mode signal CAS_WRX are generated, by the write latency to generate the delay mode output control signal WRX_END. The delay mode output control signal WRX_END may be generated to output the first to fourth latched data LC<1:4> which are latched by the pipe latch (63 of FIG. 8).

Figure 4:
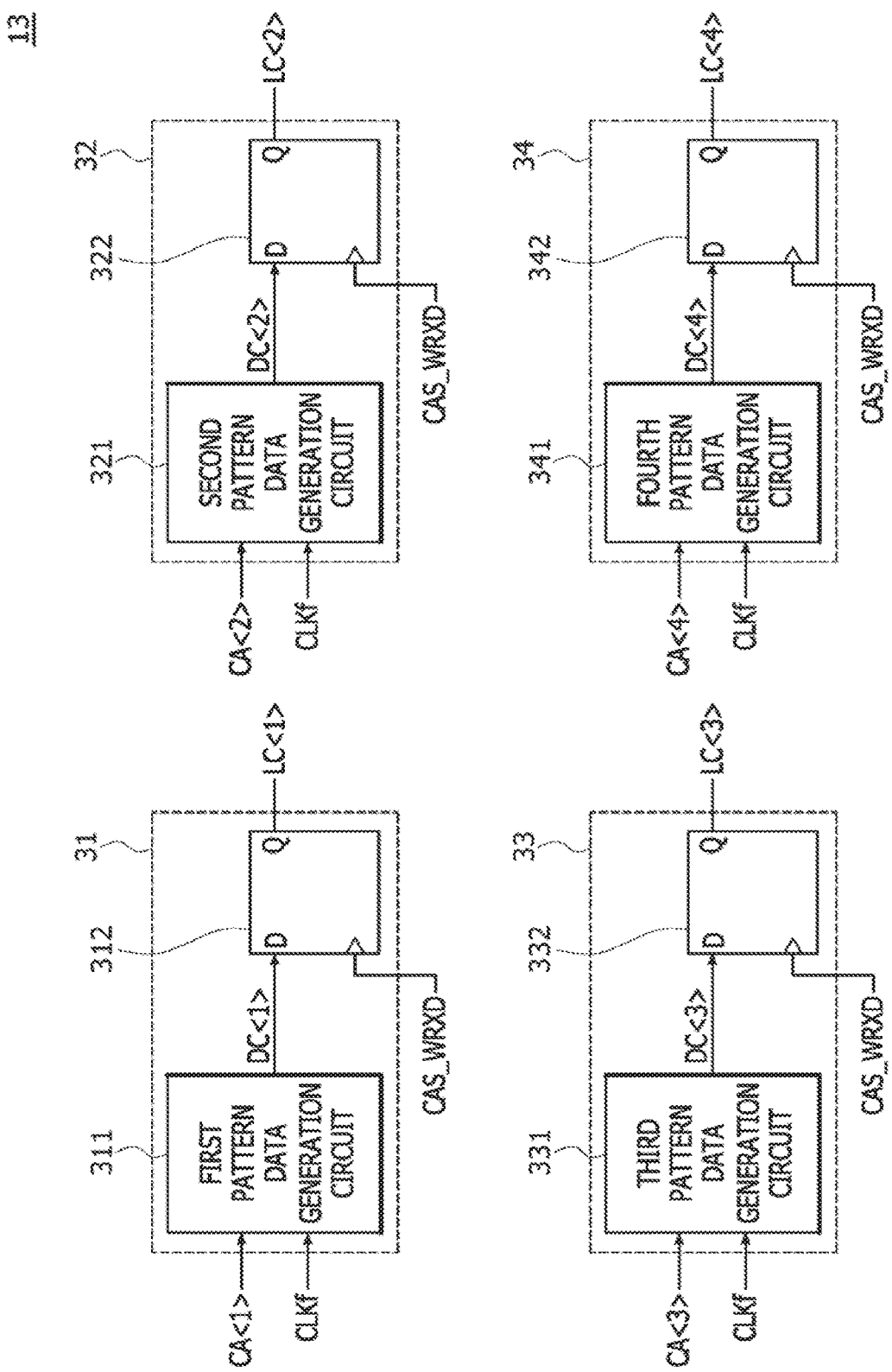
FIG. 4 is a block diagram illustrating a configuration of a latch data generation circuit included in the semiconductor device of FIG. 1.

As illustrated in FIG. 4, the latch data generation circuit 13 may include a first latch data generation circuit 31, a second latch data generation circuit 32, a third latch data generation circuit 33, and a fourth latch data generation circuit 34.

The first latch data generation circuit 31 may include a first pattern data generation circuit 311 and a first latch data output circuit 312. The first pattern data generation circuit 311 may latch the first external signal CA<1> in synchronization with a rising edge of the second internal clock signal CLKf and may output the latched signal of the first external signal CA<1> as a first pattern data DC<1>. The first latch data output circuit 312 may latch the first pattern data DC<1> if the delay mode signal CAS_WRXD is generated and may output the latched data of the first pattern data DC<1> as the first latched data LC<1>. Each of the first pattern data generation circuit 311 and the first latch data output circuit 312 may be realized using a D-flipflop.

The second latch data generation circuit 32 may include a second pattern data generation circuit 321 and a second latch data output circuit 322. The second pattern data generation circuit 321 may latch the second external signal CA<2> in synchronization with a rising edge of the second internal clock signal CLKf and may output the latched signal of the second external signal CA<2> as a second pattern data DC<2>. The second latch data output circuit 322 may latch the second pattern data DC<2> if the delay mode signal CAS_WRXD is generated and may output the latched data of the second pattern data DC<2> as the second latched data LC<2>. Each of the second pattern data generation circuit 321 and the second latch data output circuit 322 may be realized using a D-flipflop.

The third latch data generation circuit 33 may include a third pattern data generation circuit 331 and a third latch data output circuit 332. The third pattern data generation circuit 331 may latch the third external signal CA<3> in synchronization with a rising edge of the second internal clock signal CLKf and may output the latched signal of the third external signal CA<3> as a third pattern data DC<3>. The third latch data output circuit 332 may latch the third pattern data DC<3> if the delay mode signal CAS_WRXD is generated and may output the latched data of the third pattern data DC<3> as the third latched data LC<3>. Each of the third pattern data generation circuit 331 and the third latch data output circuit 332 may be realized using a D-flipflop.

The fourth latch data generation circuit 34 may include a fourth pattern data generation circuit 341 and a fourth latch data output circuit 342. The fourth pattern data generation circuit 341 may latch the fourth external signal CA<4> in synchronization with a rising edge of the second internal clock signal CLKf and may output the latched signal of the fourth external signal CA<4> as a fourth pattern data DC<4>. The fourth latch data output circuit 342 may latch the fourth pattern data DC<4> if the delay mode signal CAS_WRXD is generated and may output the latched data of the fourth pattern data DC<4> as the fourth latched data LC<4>. Each of the fourth pattern data generation circuit 341 and the fourth latch data output circuit 342 may be realized using a D-flipflop.

As described above, the latch data generation circuit 13 may generate the first to fourth latched data LC<1:4> from the first to fourth external signals CA<1:4> in response to the second internal clock signal CLKf and the delay mode signal CAS_WRXD. The latch data generation circuit 13 may generate the first to fourth latched data LC<1:4> which are stored into the core circuit 16 in the pattern input mode. The latch data generation circuit 13 may receive the first to fourth external signals CA<1:4> in synchronization with the second internal clock signal CLKf and may latch the first to fourth external signals CA<1:4> in synchronization with the delay mode signal CAS_WRXD to generate the first to fourth latched data LC<1:4>. In an embodiment, the latch data generation circuit 13 may reenter the pattern input mode during a write latency (i.e., write latency period) after the write command (WR of FIG. 15) is inputted, through the external signals CA<1:L>, to generate the latched data from the first to fourth external signals CA<1:4>.

As illustrated in FIG. 5, operations for setting the mode command CASF and the mode signal CAS_WRX in the mode control circuit 12 are illustrated, and operations for setting the first to fourth pattern data <1:4> in the latch data generation circuit 13 are illustrated.

The mode command CASF may be generated if the chip selection signal CS has a logic "high" level and the first to fourth external signals CA<1:4> are set to have a logic level combination of 'L,L,H,H' in synchronization with a rising edge of the first internal clock signal CLKr. If the chip selection signal CS has a logic "high" level, the fifth, sixth, and seventh external signals CA<5:7> may be respectively set as a first set command WS_MR, a second set command WS_RD, and a third set command WS_FS in synchronization with a rising edge of the first internal clock signal CLKr. The first set command WS_WR may be generated to receive a clock which is used for data I/O operations while the write operation is performed. The second set command WS_RD may be generated to receive a clock which is used for data I/O operations while a read operation is performed. The third set command WS_FS may be generated for a multi-rank operation. The first to seventh external signals CA<1:7> may be respectively set as the first to fourth pattern data DC<1:4>, the mode signal CAS_WRX, a signal having a valid logic level V, and a control signal B3 for determining a burst sequence in synchronization with a rising edge of the second internal clock signal CLKf after the mode command CASF is generated. The valid logic level V may be set as a logic "high" level or a logic "low" level.

Figure 6:
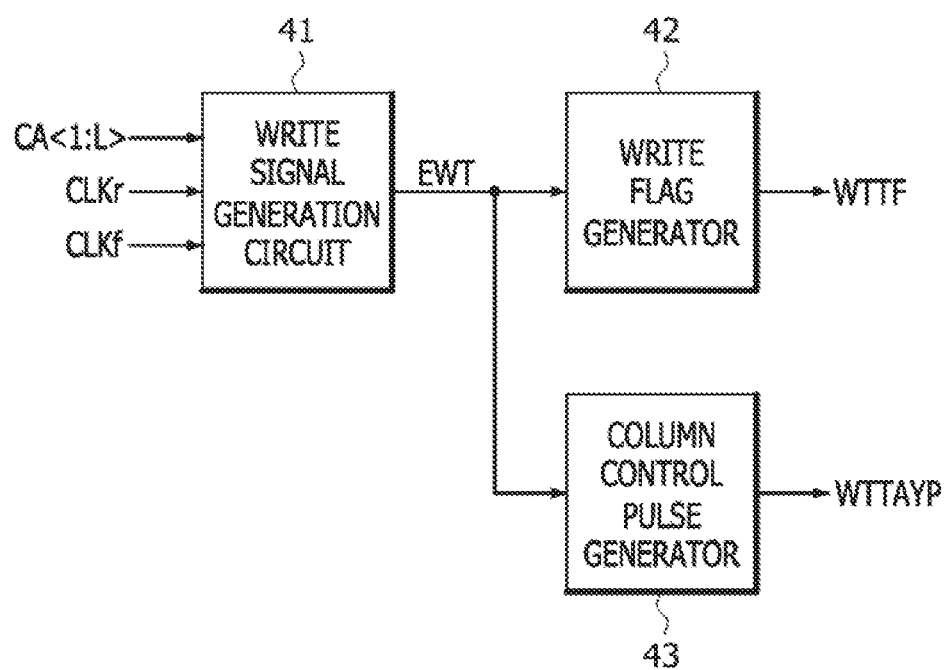
FIG. 6 is a block diagram illustrating a configuration of a column control circuit included in the semiconductor device of FIG. 1.

As illustrated in FIG. 6, the column control circuit 14 may include a write signal generation circuit 41, a write flag generator 42, and a column control pulse generator 43.

The write signal generation circuit 41 may decode the first to $L^{th}$ external signals CA<1:L> in synchronization with the first internal clock signal CLKr and the second internal clock signal CLKf to generate the write signal EWT for performing the write operation. In order to generate the write signal EWT, a write command (WR of FIG. 15) may be inputted to the semiconductor device 1 in synchronization with the first internal clock signal CLKr and the second internal clock signal CLKf through the first to $L^{th}$ external signals CA<1:L>. A clock for generating the write signal EWT may be set as the first internal clock signal CLKr or the second internal clock signal CLKf according to the embodiments. The number 'L' of bits included in the first to $L^{th}$ external signals CA<1:L> for generating the write signal EWT may be set to be different according to the embodiments.

The write flag generator 42 may shift the write signal EWT by a predetermined period to generate the write flag WTTF. The write flag generator 42 may shift the write signal EWT by a period set according to the write latency to generate the write flag WTTF.

The column control pulse generator 43 may shift the write signal EWT by a predetermined period to generate the column control pulse WTTAYP. The column control pulse generator 43 may shift the write signal EWT by a period set according to the write latency to generate the column control pulse WTTAYP.

Figure 7:
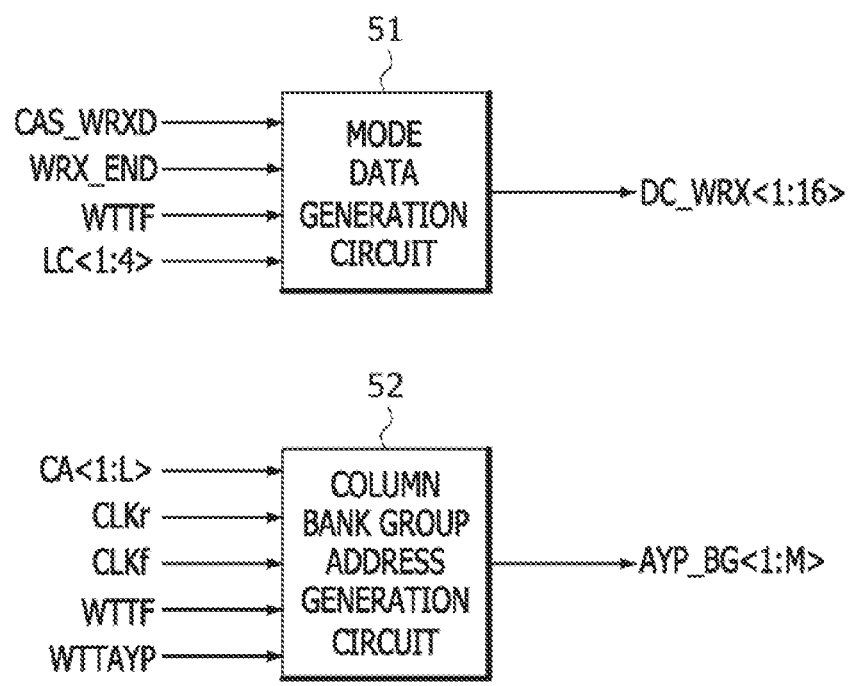
FIG. 7 is a block diagram illustrating a configuration of a column path circuit included in the semiconductor device of FIG. 1.

As illustrated in FIG. 7, the column path circuit 15 may include a mode data generation circuit 51 and a column bank group address generation circuit 52.

The mode data generation circuit 51 may generate the first to sixteenth mode data DC_WRX<1:16> from the first to fourth latched data LC<1:4> in response to the delay mode signal CAS_WRXD, the delay mode output control signal WRX_END, and the write flag WTTF. The mode data generation circuit 51 may store the first to fourth latched data LC<1:4> into the pipe latch (63 of FIG. 8) in response to the delay mode signal CAS_WRXD. The mode data generation circuit 51 may output the first to fourth latched data LC<1:4> stored in the pipe latch (63 of FIG. 8) as the first to fourth pipe data (PD<1:4> of FIG. 8) in response to the delay mode output control signal WRX_END and the write flag WTTF. The mode data generation circuit 51 may decode the first to fourth pipe data (PD<1:4> of FIG. 8) to generate the first to sixteenth mode data DC_WRX<1:16>. In an embodiment, when the mode data generation circuit 51 receives the delay mode output control signal WRX_END and the write flag WTTF during a write latency (i.e., write latency period) after the write command (WR of FIG. 15) is inputted, the mode data generation circuit 51 may output the first to fourth latched data LC<1:4> stored in the pipe latch (63 of FIG. 8) as the first to fourth pipe data (PD<1:4> of FIG. 8), and the mode data generation circuit 51 may decode the first to fourth pipe data (PD<1:4> of FIG. 8) to generate the first to sixteenth mode data DC_WRX<1:16>.

The column bank group address generation circuit 52 may generate the first to $M^{th}$ column bank group addresses AYP_BG<1:M> from the first to $L^{th}$ external signals CA<1:L> in response to the first internal clock signal CLKr and the second internal clock signal CLKf if the write flag WTTF and the column control pulse WTTAYP are generated. The first to $M^{th}$ column bank group addresses AYP_BG<1:M> may have a logic level combination for selecting a cell array included in the core circuit 16 in which the first to sixteenth mode data DC_WRX<1:16> are stored in the pattern input mode. The first to $M^{th}$ column bank group addresses AYP_BG<1:M> may include information on bank groups, banks, and column paths which are included in the core circuit 16.

Figure 8:
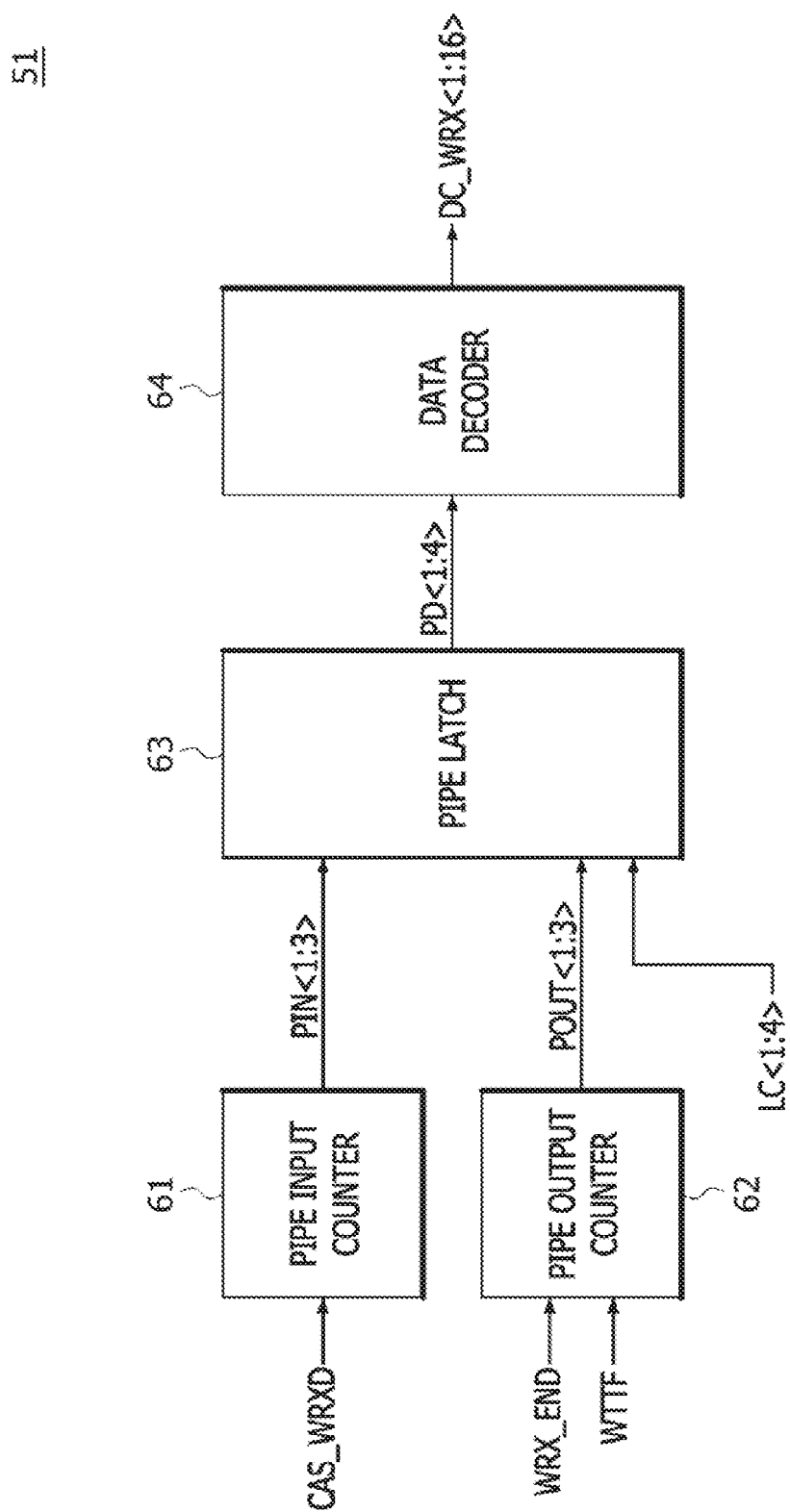
FIG. 8 is a block diagram illustrating a configuration of a mode data generation circuit included in the column path circuit of FIG. 7.

As illustrated in FIG. 8, the mode data generation circuit 51 may include a pipe input counter 61, a pipe output counter 62, a pipe latch 63, and a data decoder 64.

The pipe input counter 61 may sequentially generate first to third pipe input signals PIN<1:3> in response to the delay mode signal CAS_WRXD. The pipe input counter 61 may generate the first pipe input signal PIN<1> when the delay mode signal CAS_WRXD is first generated. The pipe input counter 61 may generate the second pipe input signal PIN<2> when the delay mode signal CAS_WRXD is generated a second time. The pipe input counter 61 may generate the third pipe input signal PIN<3> when the delay mode signal CAS_WRXD is generated a third time. For example, the pipe input counter 61 may count first to third pipe input signals PIN<1:3> when the delay mode signal CAS_WRXD is generated first, second, and third times.

The pipe output counter 62 may sequentially generate first to third pipe output signals POUT<1:3> in response to the delay mode output control signal WRX_END and the write flag WTTF. The pipe output counter 62 may generate the first pipe output signal POUT<1> when the delay mode output control signal WRX_END and the write flag WTTF are first generated. The pipe output counter 62 may generate the second pipe output signal POUT<2> when the delay mode output control signal WRX_END and the write flag WTTF are generated a second time. The pipe output counter 62 may generate the third pipe output signal POUT<3> when the delay mode output control signal WRX_END and the write flag WTTF are generated a third time. For example, the pipe output counter 62 may count first to third pipe output signals POUT<1:3> when the delay mode output control signal WRX_END and the write flag WTTF are generated first, second, and third times.

The pipe latch 63 may generate the first to fourth pipe data PD<1:4> from the first to fourth latched data LC<1:4> in response to the first to third pipe input signals PIN<1:3> and the first to third pipe output signals POUT<1:3>. The pipe latch 63 may latch (i.e., store) the first to fourth latched data LC<1:4> in response to the first to third pipe input signals PIN<1:3>. The pipe latch 63 may output the latched data (i.e., the stored data) of the first to fourth latched data LC<1:4> as the first to fourth pipe data PD<1:4> in response to the first to third pipe output signals POUT<1:3>. A configuration and an operation of the pipe latch 63 will be described with reference to FIGS. 9 and 10 later.

The data decoder 64 may decode the first to fourth pipe data PD<1:4> to generate the first to sixteenth mode data DC_WRX<1:16>. Logic level combinations of the first to fourth pipe data PD<1:4> and logic level combinations of the first to sixteenth mode data DC_WRX<1:16> generated by the data decoder 64 in response to the logic level combinations of the first to fourth pipe data PD<1:4> may be set to be different according to the embodiments. A configuration and an operation of the data decoder 64 will be described with reference to FIGS. 11 to 14 later.

Figure 9:
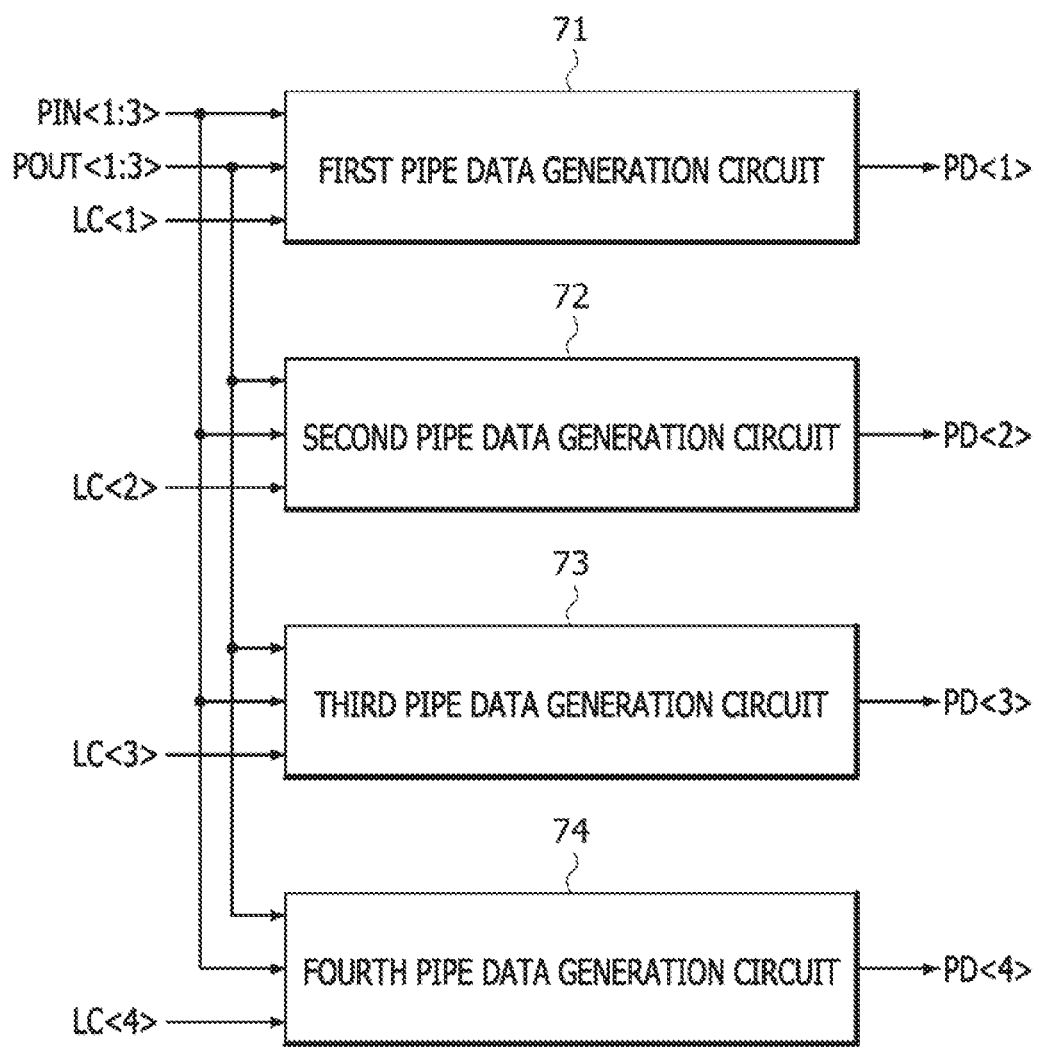
FIG. 9 is a block diagram illustrating a configuration of a pipe latch included in the mode data generation circuit of FIG. 8.

As illustrated in FIG. 9, the pipe latch 63 may include a first pipe data generation circuit 71, a second pipe data generation circuit 72, a third pipe data generation circuit 73, and a fourth pipe data generation circuit 74.

The first pipe data generation circuit 71 may generate the first pipe data PD<1> from the first latched data LC<1> in response to the first to third pipe input signals PIN<1:3> and the first to third pipe output signals POUT<1:3>. The first pipe data generation circuit 71 may latch the first latched data LC<1> in response to the first to third pipe input signals PIN<1:3>. The first pipe data generation circuit 71 may output the latched data of the first latched data LC<1> as the first pipe data PD<1> in response to the first to third pipe output signals POUT<1:3>. A configuration and an operation of the first pipe data generation circuit 71 will be described with reference to FIG. 10 later.

The second pipe data generation circuit 72 may generate the second pipe data PD<2> from the second latched data LC<2> in response to the first to third pipe input signals PIN<1:3> and the first to third pipe output signals POUT<1:3>. The second pipe data generation circuit 72 may latch the second latched data LC<2> in response to the first to third pipe input signals PIN<1:3>. The second pipe data generation circuit 72 may output the latched data of the second latched data LC<2> as the second pipe data PD<2> in response to the first to third pipe output signals POUT<1:3>.

The third pipe data generation circuit 73 may generate the third pipe data PD<3> from the third latched data LC<3> in response to the first to third pipe input signals PIN<1:3> and the first to third pipe output signals POUT<1:3>. The third pipe data generation circuit 73 may latch the third latched data LC<3> in response to the first to third pipe input signals PIN<1:3>. The third pipe data generation circuit 73 may output the latched data of the third latched data LC<3> as the third pipe data PD<3> in response to the first to third pipe output signals POUT<1:3>.

The fourth pipe data generation circuit 74 may generate the fourth pipe data PD<4> from the fourth latched data LC<4> in response to the first to third pipe input signals PIN<1:3> and the first to third pipe output signals POUT<1:3>. The fourth pipe data generation circuit 74 may latch the fourth latched data LC<4> in response to the first to third pipe input signals PIN<1:3>. The fourth pipe data generation circuit 74 may output the latched data of the fourth latched data LC<4> as the fourth pipe data PD<4> in response to the first to third pipe output signals POUT<1:3>.

Figure 10:
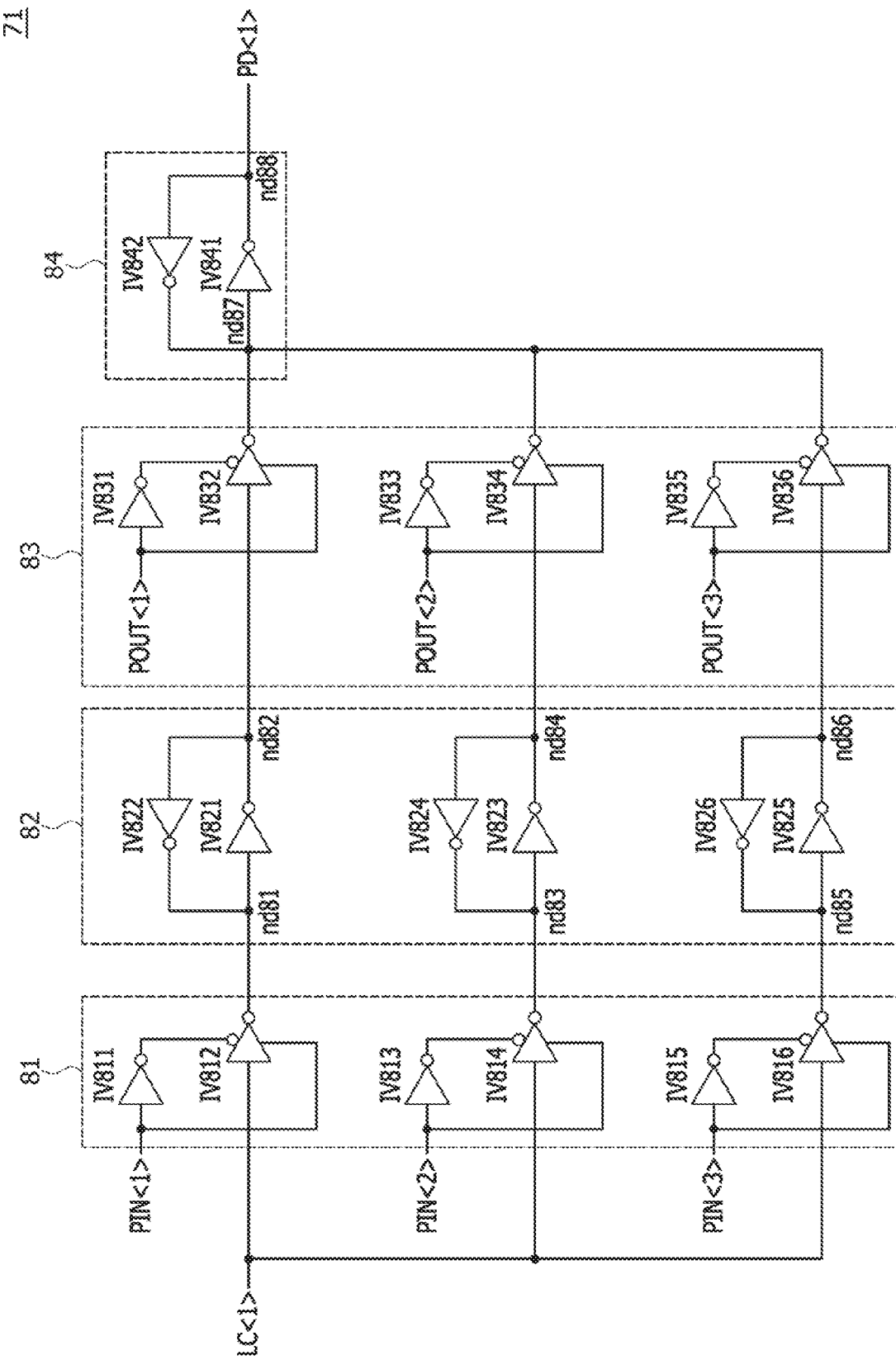
FIG. 10 is a circuit diagram illustrating a configuration of a first pipe data generation circuit included in the pipe latch of FIG. 9.

As illustrated in FIG. 10, the first pipe data generation circuit 71 may include a data input circuit 81, a data latch circuit 82, a pattern data output circuit 83, and a pattern data output latch 84.

The data input circuit 81 may include inverters IV811~IV816. The inverter IV811 may inversely buffer the first pipe input signal PIN<1> to output the inversely buffered signal of the first pipe input signal PIN<1>. The inverter IV812 may inversely buffer the first latched data LC<1> to output the inversely buffered data of the first latched data LC<1> to a node nd81 if the first pipe input signal PIN<1> has a logic "high" level. The inverter IV813 may inversely buffer the second pipe input signal PIN<2> to output the inversely buffered signal of the second pipe input signal PIN<2>. The inverter IV814 may inversely buffer the first latched data LC<1> to output the inversely buffered data of the first latched data LC<1> to a node nd83 if the second pipe input signal PIN<2> has a logic "high" level. The inverter IV815 may inversely buffer the third pipe input signal PIN<3> to output the inversely buffered signal of the third pipe input signal PIN<3>. The inverter IV816 may inversely buffer the first latched data LC<1> to output the inversely buffered data of the first latched data LC<1> to a node nd85 if the third pipe input signal PIN<3> has a logic "high" level.

The data latch circuit 82 may include inverters IV821~IV826. The inverter IV821 may inversely buffer a signal of the node nd81 to output the inversely buffered signal of the signal of the node nd81 to a node nd82. The inverter IV822 may inversely buffer a signal of the node nd82 to output the inversely buffered signal of the signal of the node nd82 to the node nd81. That is, the inverters IV821 and IV822 may latch the signals of the nodes nd81 and nd82. The inverter IV823 may inversely buffer a signal of the node nd83 to output the inversely buffered signal of the signal of the node nd83 to a node nd84. The inverter IV824 may inversely buffer a signal of the node nd84 to output the inversely buffered signal of the signal of the node nd84 to the node nd83. That is, the inverters IV823 and IV824 may latch the signals of the nodes nd83 and nd84. The inverter IV825 may inversely buffer a signal of the node nd85 to output the inversely buffered signal of the signal of the node nd85 to a node nd86. The inverter IV826 may inversely buffer a signal of the node nd86 to output the inversely buffered signal of the signal of the node nd86 to the node nd85. That is, the inverters IV825 and IV826 may latch the signals of the nodes nd85 and nd86.

The pattern data output circuit 83 may include inverters IV831~IV836. The inverter IV831 may inversely buffer the first pipe output signal POUT<1> to output the inversely buffered signal of the first pipe output signal POUT<1>. The inverter IV832 may inversely buffer a signal of the node nd82 to output the inversely buffered data of the signal of the node nd82 to a node nd87 if the first pipe output signal POUT<1> has a logic "high" level. The inverter IV833 may inversely buffer the second pipe output signal POUT<2> to output the inversely buffered signal of the second pipe output signal POUT<2>. The inverter IV834 may inversely buffer a signal of the node nd84 to output the inversely buffered data of the signal of the node nd84 to the node nd87 if the second pipe output signal POUT<2> has a logic "high" level. The inverter IV835 may inversely buffer the third pipe output signal POUT<3> to output the inversely buffered signal of the third pipe output signal POUT<3>. The inverter IV836 may inversely buffer a signal of the node nd86 to output the inversely buffered data of the signal of the node nd86 to the node nd87 if the third pipe output signal POUT<3> has a logic "high" level.

The pattern data output latch 84 may include inverters IV841 and IV842. The inverter IV841 may inversely buffer a signal of the node nd87 to output the inversely buffered signal of the signal of the node nd87 as the first pipe data PD<1> through a node nd88. The inverter IV842 may inversely buffer a signal of the node nd88 to output the inversely buffered signal of the signal of the node nd88 to the node nd87. That is, the inverters IV841 and IV842 may latch the signals of the nodes nd87 and nd88.

As described above, the first pipe data generation circuit 71 may latch the first latched data LC<1> in response to the first to third pipe input signals PIN<1:3>. The first pipe data generation circuit 71 may output the latched data of the first latched data LC<1> as the first pipe data PD<1> in response to the first to third pipe output signals POUT<1:3>.

Figure 11:
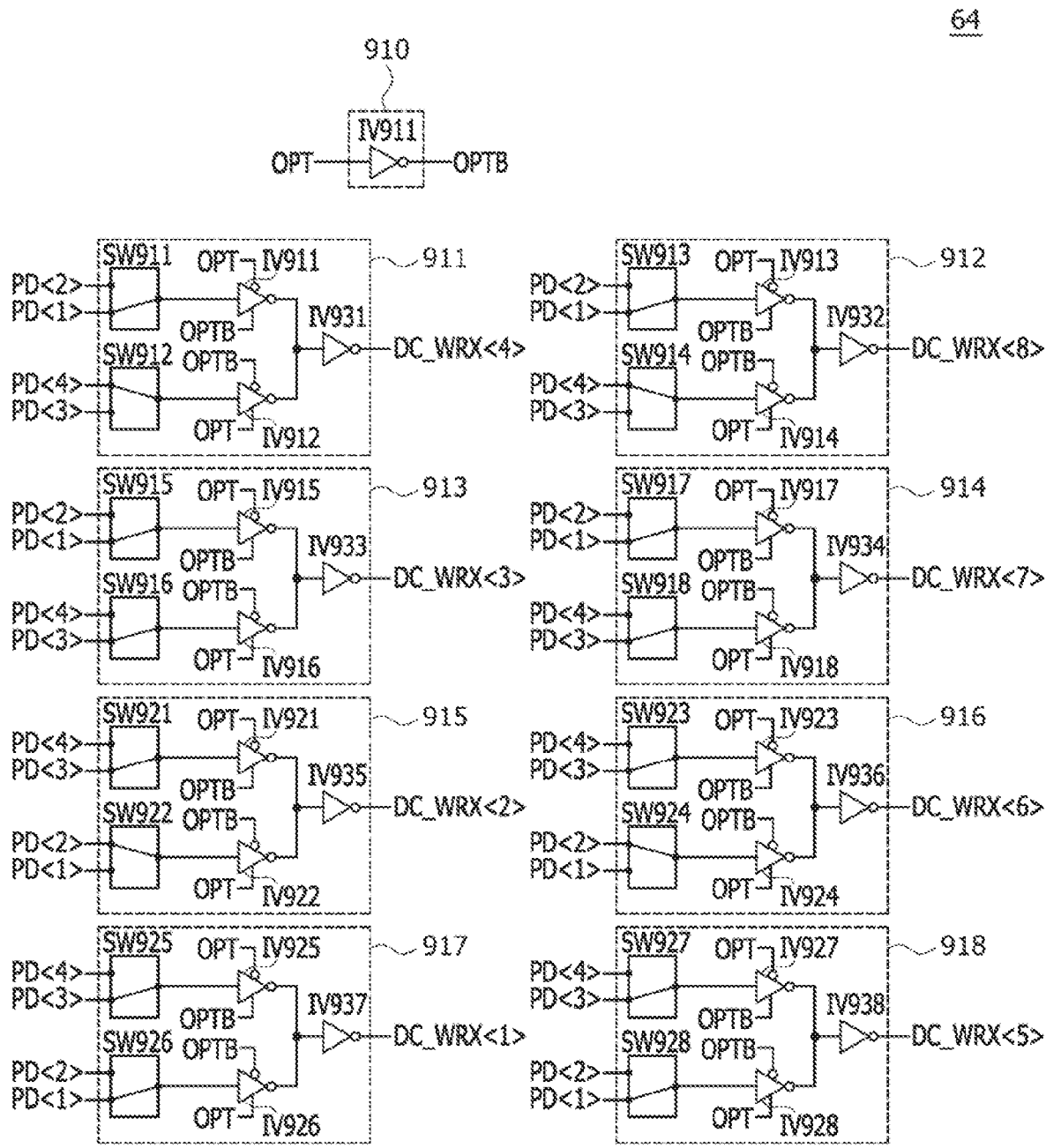
FIGS. 11 and 12 are circuit diagrams illustrating a configuration of a data decoder included in the mode data generation circuit of FIG. 8.
Figure 12:
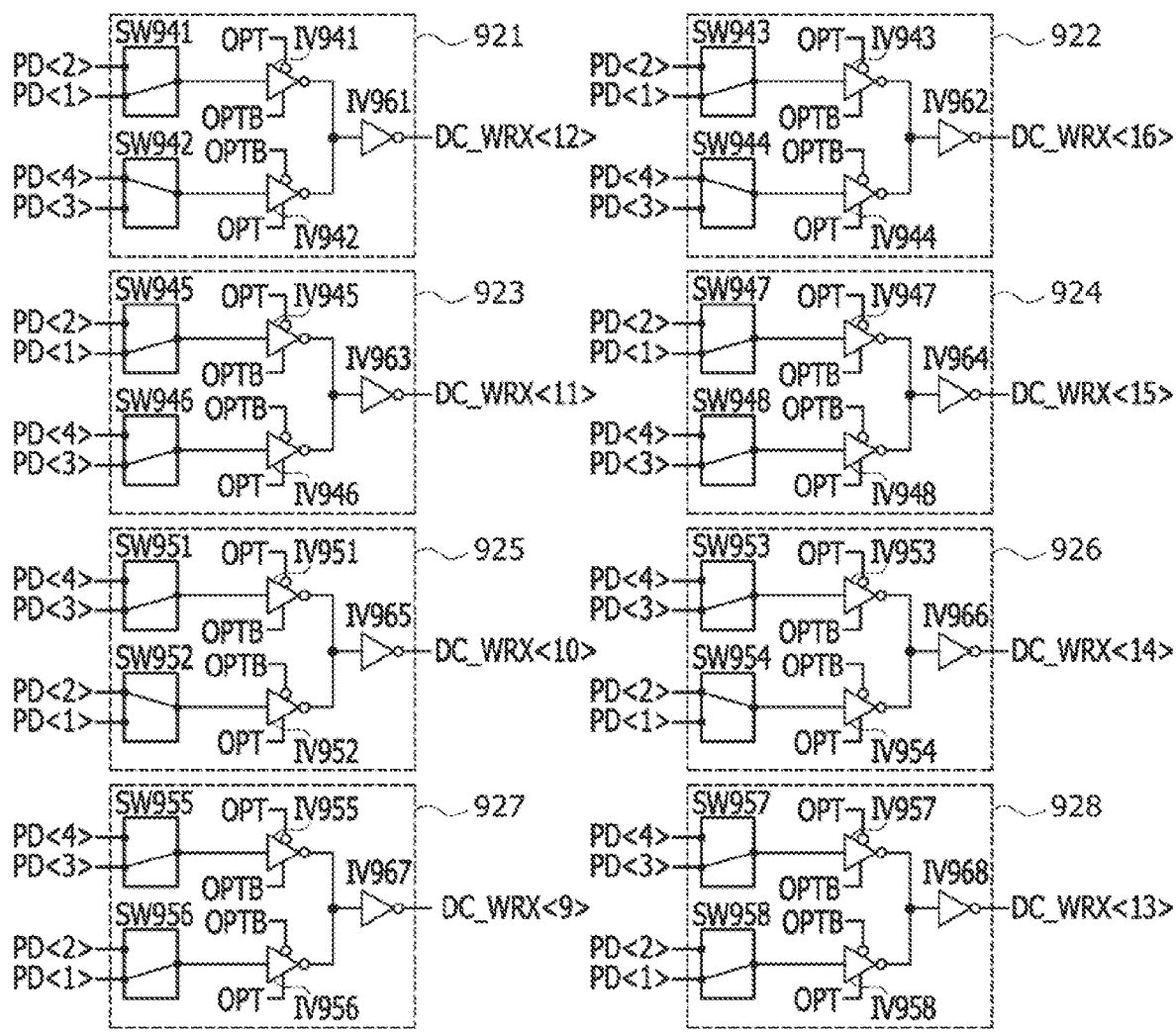

As illustrated in FIGS. 11 and 12, the data decoder 64 may include an inverted option signal generation circuit 910, a first mode data selection circuit 911, a second mode data selection circuit 912, a third mode data selection circuit 913, a fourth mode data selection circuit 914, a fifth mode data selection circuit 915, a sixth mode data selection circuit 916, a seventh mode data selection circuit 917, an eighth mode data selection circuit 918, a ninth mode data selection circuit 921, a tenth mode data selection circuit 922, an eleventh mode data selection circuit 923, a twelfth mode data selection circuit 924, a thirteenth mode data selection circuit 925, a fourteenth mode data selection circuit 926, a fifteenth mode data selection circuit 927, and a sixteenth mode data selection circuit 928.

The inverted option signal generation circuit 910 may include an inverter IV911 that inversely buffers an option signal OPT to generate an inverted option signal OPTS. In an embodiment, a logic level of the option signal OPT may be determined according to an electrical open/short state of a fuse (not shown) included in the semiconductor device 1. The option signal OPT may be provided by an external device or may be generated by the semiconductor device 1 according to the embodiments.

The first mode data selection circuit 911 may include switches SW911 and SW912 and inverters IV911, IV912, and IV931. The switch SW911 may selectively output the second pipe data PD<2> or the first pipe data PD<1>. The switch SW912 may selectively output the fourth pipe data PD<4> or the third pipe data PD<3>. The inverter IV911 may inversely buffer an output signal of the switch SW911 to output the inversely buffered signal of the output signal of the switch SW911 if the option signal OPT has a logic "low" level. The inverter IV912 may inversely buffer an output signal of the switch SW912 to output the inversely buffered signal of the output signal of the switch SW912 if the option signal OPT has a logic "high" level. The inverter 931 may inversely buffer an output signal of the inverter IV911 or the inverter IV912 to output the inversely buffered signal of the output signal of the inverter IV911 or the inverter IV912 as the fourth mode data DC_WRX<4>. In an embodiment, the switch SW911 may be configured to output the first pipe data PD<1>, the switch SW912 may be configured to output the fourth pipe data PD<4>, and the option signal OPT may be set to have a logic "high" level. Thus, the first mode data selection circuit 911 may output the fourth pipe data PD<4> as the fourth mode data DC_WRX<4>.

The second mode data selection circuit 912 may include switches SW913 and SW914 and inverters IV913, IV914, and IV932. The switch SW913 may selectively output the second pipe data PD<2> or the first pipe data PD<1>. The switch SW914 may selectively output the fourth pipe data PD<4> or the third pipe data PD<3>. The inverter IV913 may inversely buffer an output signal of the switch SW913 to output the inversely buffered signal of the output signal of the switch SW913 if the option signal OPT has a logic "low" level. The inverter IV914 may inversely buffer an output signal of the switch SW914 to output the inversely buffered signal of the output signal of the switch SW914 if the option signal OPT has a logic "high" level. The inverter 932 may inversely buffer an output signal of the inverter IV913 or the inverter IV914 to output the inversely buffered signal of the output signal of the inverter IV913 or the inverter IV914 as the eighth mode data DC_WRX<8>. In an embodiment, the switch SW913 may be configured to output the first pipe data PD<1>, the switch SW914 may be configured to output the fourth pipe data PD<4>, and the option signal OPT may be set to have a logic "high" level. Thus, the second mode data selection circuit 912 may output the fourth pipe data PD<4> as the eighth mode data DC_WRX<8>.

The third mode data selection circuit 913 may include switches SW915 and SW916 and inverters IV915, IV916, and IV933. The switch SW915 may selectively output the second pipe data PD<2> or the first pipe data PD<1>. The switch SW916 may selectively output the fourth pipe data PD<4> or the third pipe data PD<3>. The inverter IV915 may inversely buffer an output signal of the switch SW915 to output the inversely buffered signal of the output signal of the switch SW915 if the option signal OPT has a logic "low" level. The inverter IV916 may inversely buffer an output signal of the switch SW916 to output the inversely buffered signal of the output signal of the switch SW916 if the option signal OPT has a logic "high" level. The inverter 933 may inversely buffer an output signal of the inverter IV915 or the inverter IV916 to output the inversely buffered signal of the output signal of the inverter IV915 or the inverter IV916 as the third mode data DC_WRX<3>. In an embodiment, the switch SW915 may be configured to output the first pipe data PD<1>, the switch SW916 may be configured to output the third pipe data PD<3>, and the option signal OPT may be set to have a logic "high" level. Thus, the third mode data selection circuit 913 may output the third pipe data PD<3> as the third mode data DC_WRX<3>.

The fourth mode data selection circuit 914 may include switches SW917 and SW918 and inverters IV917, IV918, and IV934. The switch SW917 may selectively output the second pipe data PD<2> or the first pipe data PD<1>. The switch SW918 may selectively output the fourth pipe data PD<4> or the third pipe data PD<3>. The inverter IV917 may inversely buffer an output signal of the switch SW917 to output the inversely buffered signal of the output signal of the switch SW917 if the option signal OPT has a logic "low" level. The inverter IV918 may inversely buffer an output signal of the switch SW918 to output the inversely buffered signal of the output signal of the switch SW918 if the option signal OPT has a logic "high" level. The inverter 934 may inversely buffer an output signal of the inverter IV917 or the inverter IV918 to output the inversely buffered signal of the output signal of the inverter IV917 or the inverter IV918 as the seventh mode data DC_WRX<7>. In an embodiment, the switch SW917 may be configured to output the first pipe data PD<1>, the switch SW918 may be configured to output the third pipe data PD<3>, and the option signal OPT may be set to have a logic "high" level. Thus, the fourth mode data selection circuit 914 may output the third pipe data PD<3> as the seventh mode data DC_WRX<7>.

The fifth mode data selection circuit 915 may include switches SW921 and SW922 and inverters IV921, IV922, and IV935. The switch SW921 may selectively output the fourth pipe data PD<4> or the third pipe data PD<3>. The switch SW922 may selectively output the second pipe data PD<2> or the first pipe data PD<1>. The inverter IV921 may inversely buffer an output signal of the switch SW921 to output the inversely buffered signal of the output signal of the switch SW921 if the option signal OPT has a logic "low" level. The inverter IV922 may inversely buffer an output signal of the switch SW922 to output the inversely buffered signal of the output signal of the switch SW922 if the option signal OPT has a logic "high" level. The inverter 935 may inversely buffer an output signal of the inverter IV921 or the inverter IV922 to output the inversely buffered signal of the output signal of the inverter IV921 or the inverter IV922 as the second mode data DC_WRX<2>. In an embodiment, the switch SW921 may be configured to output the third pipe data PD<3>, the switch SW922 may be configured to output the second pipe data PD<2>, and the option signal OPT may be set to have a logic "high" level. Thus, the fifth mode data selection circuit 915 may output the second pipe data PD<2> as the second mode data DC_WRX<2>.

The sixth mode data selection circuit 916 may include switches SW923 and SW924 and inverters IV923, IV924, and IV936. The switch SW923 may selectively output the fourth pipe data PD<4> or the third pipe data PD<3>. The switch SW924 may selectively output the second pipe data PD<2> or the first pipe data PD<1>. The inverter IV923 may inversely buffer an output signal of the switch SW923 to output the inversely buffered signal of the output signal of the switch SW923 if the option signal OPT has a logic "low" level. The inverter IV924 may inversely buffer an output signal of the switch SW924 to output the inversely buffered signal of the output signal of the switch SW924 if the option signal OPT has a logic "high" level. The inverter 936 may inversely buffer an output signal of the inverter IV923 or the inverter IV924 to output the inversely buffered signal of the output signal of the inverter IV923 or the inverter IV924 as the sixth mode data DC_WRX<6>. In an embodiment, the switch SW923 may be configured to output the third pipe data PD<3>, the switch SW924 may be configured to output the second pipe data PD<2>, and the option signal OPT may be set to have a logic "high" level. Thus, the sixth mode data selection circuit 916 may output the second pipe data PD<2> as the sixth mode data DC_WRX<6>.

The seventh mode data selection circuit 917 may include switches SW925 and SW926 and inverters IV925, IV926, and IV937. The switch SW925 may selectively output the fourth pipe data PD<4> or the third pipe data PD<3>. The switch SW926 may selectively output the second pipe data PD<2> or the first pipe data PD<1>. The inverter IV925 may inversely buffer an output signal of the switch SW925 to output the inversely buffered signal of the output signal of the switch SW925 if the option signal OPT has a logic "low" level. The inverter IV926 may inversely buffer an output signal of the switch SW926 to output the inversely buffered signal of the output signal of the switch SW926 if the option signal OPT has a logic "high" level. The inverter 937 may inversely buffer an output signal of the inverter IV925 or the inverter IV926 to output the inversely buffered signal of the output signal of the inverter IV925 or the inverter IV926 as the first mode data DC_WRX<1>. In an embodiment, the switch SW925 may be configured to output the third pipe data PD<3>, the switch SW926 may be configured to output the first pipe data PD<1>, and the option signal OPT may be set to have a logic "high" level. Thus, the seventh mode data selection circuit 917 may output the first pipe data PD<1> as the first mode data DC_WRX<1>.

The eighth mode data selection circuit 918 may include switches SW927 and SW928 and inverters W927, IV928, and IV938. The switch SW927 may selectively output the fourth pipe data PD<4> or the third pipe data PD<3>. The switch SW928 may selectively output the second pipe data PD<2> or the first pipe data PD<1>. The inverter IV927 may inversely buffer an output signal of the switch SW927 to output the inversely buffered signal of the output signal of the switch SW927 if the option signal OPT has a logic "low" level. The inverter IV928 may inversely buffer an output signal of the switch SW928 to output the inversely buffered signal of the output signal of the switch SW928 if the option signal OPT has a logic "high" level. The inverter 938 may inversely buffer an output signal of the inverter IV927 or the inverter IV928 to output the inversely buffered signal of the output signal of the inverter IV927 or the inverter IV928 as the fifth mode data DC_WRX<5>. In an embodiment, the switch SW927 may be configured to output the third pipe data PD<3>, the switch SW928 may be configured to output the first pipe data PD<1>, and the option signal OPT may be set to have a logic "high" level. Thus, the eighth mode data selection circuit 918 may output the first pipe data PD<1> as the fifth mode data DC_WRX<5>.

The ninth mode data selection circuit 921 may include switches SW941 and SW942 and inverters IV941, IV942, and IV961. The switch SW941 may selectively output the second pipe data PD<2> or the first pipe data PD<1>. The switch SW942 may selectively output the fourth pipe data PD<4> or the third pipe data PD<3>. The inverter IV941 may inversely buffer an output signal of the switch SW941 to output the inversely buffered signal of the output signal of the switch SW941 if the option signal OPT has a logic "low" level. The inverter IV942 may inversely buffer an output signal of the switch SW942 to output the inversely buffered signal of the output signal of the switch SW942 if the option signal OPT has a logic "high" level. The inverter 961 may inversely buffer an output signal of the inverter IV941 or the inverter IV942 to output the inversely buffered signal of the output signal of the inverter IV941 or the inverter IV942 as the twelfth mode data DC_WRX<12>. In an embodiment, the switch SW941 may be configured to output the first pipe data PD<1>, the switch SW942 may be configured to output the fourth pipe data PD<4>, and the option signal OPT may be set to have a logic "high" level. Thus, the ninth mode data selection circuit 921 may output the fourth pipe data PD<4> as the twelfth mode data DC_WRX<12>.

The tenth mode data selection circuit 922 may include switches SW943 and SW944 and inverters IV943, IV944, and IV962. The switch SW943 may selectively output the second pipe data PD<2> or the first pipe data PD<1>. The switch SW944 may selectively output the fourth pipe data PD<4> or the third pipe data PD<3>. The inverter IV943 may inversely buffer an output signal of the switch SW943 to output the inversely buffered signal of the output signal of the switch SW943 if the option signal OPT has a logic "low" level. The inverter IV944 may inversely buffer an output signal of the switch SW944 to output the inversely buffered signal of the output signal of the switch SW944 if the option signal OPT has a logic "high" level. The inverter 962 may inversely buffer an output signal of the inverter IV943 or the inverter IV944 to output the inversely buffered signal of the output signal of the inverter IV943 or the inverter IV944 as the sixteenth mode data DC_WRX<16>. In an embodiment, the switch SW943 may be configured to output the first pipe data PD<1>, the switch SW944 may be configured to output the fourth pipe data PD<4>, and the option signal OPT may be set to have a logic "high" level. Thus, the tenth mode data selection circuit 922 may output the fourth pipe data PD<4> as the sixteenth mode data DC_WRX<16>.

The eleventh mode data selection circuit 923 may include switches SW945 and SW946 and inverters IV945, IV946, and W963. The switch SW945 may selectively output the second pipe data PD<2> or the first pipe data PD<1>. The switch SW946 may selectively output the fourth pipe data PD<4> or the third pipe data PD<3>. The inverter IV945 may inversely buffer an output signal of the switch SW945 to output the inversely buffered signal of the output signal of the switch SW945 if the option signal OPT has a logic "low" level. The inverter IV946 may inversely buffer an output signal of the switch SW946 to output the inversely buffered signal of the output signal of the switch SW946 if the option signal OPT has a logic "high" level. The inverter 963 may inversely buffer an output signal of the inverter IV945 or the inverter IV946 to output the inversely buffered signal of the output signal of the inverter IV945 or the inverter IV946 as the eleventh mode data DC_WRX<11>. In an embodiment, the switch SW945 may be configured to output the first pipe data PD<1>, the switch SW946 may be configured to output the third pipe data PD<3>, and the option signal OPT may be set to have a logic "high" level. Thus, the eleventh mode data selection circuit 923 may output the third pipe data PD<3> as the eleventh mode data DC_WRX<11>.

The twelfth mode data selection circuit 924 may include switches SW947 and SW948 and inverters IV947, IV948, and IV964. The switch SW947 may selectively output the second pipe data PD<2> or the first pipe data PD<1>. The switch SW948 may selectively output the fourth pipe data PD<4> or the third pipe data PD<3>. The inverter IV947 may inversely buffer an output signal of the switch SW947 to output the inversely buffered signal of the output signal of the switch SW947 if the option signal OPT has a logic "low" level. The inverter IV948 may inversely buffer an output signal of the switch SW948 to output the inversely buffered signal of the output signal of the switch SW948 if the option signal OPT has a logic "high" level. The inverter 964 may inversely buffer an output signal of the inverter IV947 or the inverter IV948 to output the inversely buffered signal of the output signal of the inverter IV947 or the inverter IV948 as the fifteenth mode data DC_WRX<15>. In an embodiment, the switch SW947 may be configured to output the first pipe data PD<1>, the switch SW948 may be configured to output the third pipe data PD<3>, and the option signal OPT may be set to have a logic "high" level. Thus, the twelfth mode data selection circuit 924 may output the third pipe data PD<3> as the fifteenth mode data DC_WRX<15>.

The thirteenth mode data selection circuit 925 may include switches SW951 and SW952 and inverters IV951, IV952, and IV965. The switch SW951 may selectively output the fourth pipe data PD<4> or the third pipe data PD<3>. The switch SW952 may selectively output the second pipe data PD<2> or the first pipe data PD<1>. The inverter IV951 may inversely buffer an output signal of the switch SW951 to output the inversely buffered signal of the output signal of the switch SW951 if the option signal OPT has a logic "low" level. The inverter IV952 may inversely buffer an output signal of the switch SW952 to output the inversely buffered signal of the output signal of the switch SW952 if the option signal OPT has a logic "high" level. The inverter 965 may inversely buffer an output signal of the inverter IV951 or the inverter IV952 to output the inversely buffered signal of the output signal of the inverter IV951 or the inverter IV952 as the tenth mode data DC_WRX<10>. In an embodiment, the switch SW951 may be configured to output the third pipe data PD<3>, the switch SW952 may be configured to output the second pipe data PD<2>, and the option signal OPT may be set to have a logic "high" level. Thus, the thirteenth mode data selection circuit 925 may output the second pipe data PD<2> as the tenth mode data DC_WRX<10>.

The fourteenth mode data selection circuit 926 may include switches SW953 and SW954 and inverters IV953, IV954, and IV966. The switch SW953 may selectively output the fourth pipe data PD<4> or the third pipe data PD<3>. The switch SW954 may selectively output the second pipe data PD<2> or the first pipe data PD<1>. The inverter IV953 may inversely buffer an output signal of the switch SW953 to output the inversely buffered signal of the output signal of the switch SW953 if the option signal OPT has a logic "low" level. The inverter IV954 may inversely buffer an output signal of the switch SW954 to output the inversely buffered signal of the output signal of the switch SW954 if the option signal OPT has a logic "high" level. The inverter 966 may inversely buffer an output signal of the inverter IV953 or the inverter IV954 to output the inversely buffered signal of the output signal of the inverter IV953 or the inverter IV954 as the fourteenth mode data DC_WRX<14>. In an embodiment, the switch SW953 may be configured to output the third pipe data PD<3>, the switch SW954 may be configured to output the second pipe data PD<2>, and the option signal OPT may be set to have a logic "high" level. Thus, the fourteenth mode data selection circuit 926 may output the second pipe data PD<2> as the fourteenth mode data DC_WRX<14>.

The fifteenth mode data selection circuit 927 may include switches SW955 and SW956 and inverters IV955, IV956, and IV967. The switch SW955 may selectively output the fourth pipe data PD<4> or the third pipe data PD<3>. The switch SW956 may selectively output the second pipe data PD<2> or the first pipe data PD<1>. The inverter IV955 may inversely buffer an output signal of the switch SW955 to output the inversely buffered signal of the output signal of the switch SW955 if the option signal OPT has a logic "low" level. The inverter IV956 may inversely buffer an output signal of the switch SW956 to output the inversely buffered signal of the output signal of the switch SW956 if the option signal OPT has a logic "high" level. The inverter 967 may inversely buffer an output signal of the inverter IV955 or the inverter IV956 to output the inversely buffered signal of the output signal of the inverter IV955 or the inverter IV956 as the ninth mode data DC_WRX<9>. In an embodiment, the switch SW955 may be configured to output the third pipe data PD<3>, the switch SW956 may be configured to output the first pipe data PD<1>, and the option signal OPT may be set to have a logic "high" level. Thus, the fifteenth mode data selection circuit 927 may output the first pipe data PD<1> as the ninth mode data DC_WRX<9>.

The sixteenth mode data selection circuit 928 may include switches SW957 and SW958 and inverters W957, IV958, and IV968. The switch SW957 may selectively output the fourth pipe data PD<4> or the third pipe data PD<3>. The switch SW958 may selectively output the second pipe data PD<2> or the first pipe data PD<1>. The inverter IV957 may inversely buffer an output signal of the switch SW957 to output the inversely buffered signal of the output signal of the switch SW957 if the option signal OPT has a logic "low" level. The inverter IV958 may inversely buffer an output signal of the switch SW958 to output the inversely buffered signal of the output signal of the switch SW958 if the option signal OPT has a logic "high" level. The inverter 968 may inversely buffer an output signal of the inverter IV957 or the inverter IV958 to output the inversely buffered signal of the output signal of the inverter IV957 or the inverter IV958 as the thirteenth mode data DC_WRX<13>. In an embodiment, the switch SW957 may be configured to output the third pipe data PD<3>, the switch SW958 may be configured to output the first pipe data PD<1>, and the option signal OPT may be set to have a logic "high" level. Thus, the sixteenth mode data selection circuit 928 may output the first pipe data PD<1> as the thirteenth mode data DC_WRX<13>.

Figure 14:
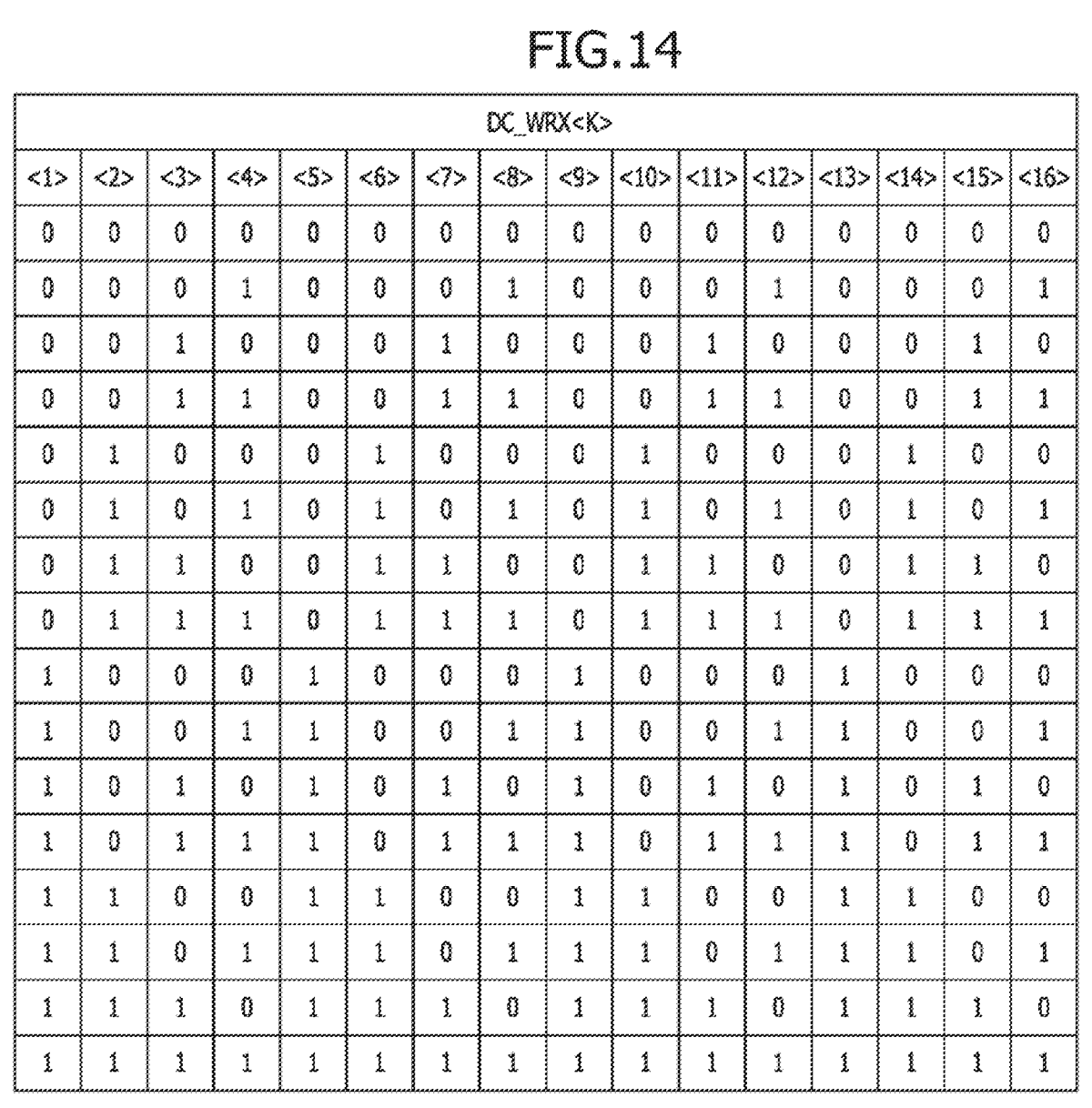

Referring to FIGS. 13 and 14, various logic level combinations of the first to sixteenth mode data DC_WRX<1:16> generated by the data decoder 64 according to logic level combinations of the first to fourth pipe data PD<1:4> are illustrated. If the first to fourth pipe data PD<1:4> having the various logic level combinations illustrated in FIG. 13 are inputted to the data decoder 64, the first to sixteenth mode data DC_WRX<1:16> having various logic level combinations illustrated in FIG. 14 may be generated.

Referring again to FIGS. 13 and 14, each of the first mode data DC_WRX<1>, the fifth mode data DC_WRX<5>, the ninth mode data DC_WRX<9>, and the thirteenth mode data DC_WRX<13> may be set to have the same logic level as the first pipe data PD<1>. Each of the second mode data DC_WRX<2>, the sixth mode data DC_WRX<6>, the tenth mode data DC_WRX<10>, and the fourteenth mode data DC_WRX<14> may be set to have the same logic level as the second pipe data PD<2>. Each of the third mode data DC_WRX<3>, the seventh mode data DC_WRX<7>, the eleventh mode data DC_WRX<11>, and the fifteenth mode data DC_WRX<15> may be set to have the same logic level as the third pipe data PD<3>. Each of the fourth mode data DC_WRX<4>, the eighth mode data DC_WRX<8>, the twelfth mode data DC_WRX<12>, and the sixteenth mode data DC_WRX<16> may be set to have the same logic level as the fourth pipe data PD<4>.

Figure 15:
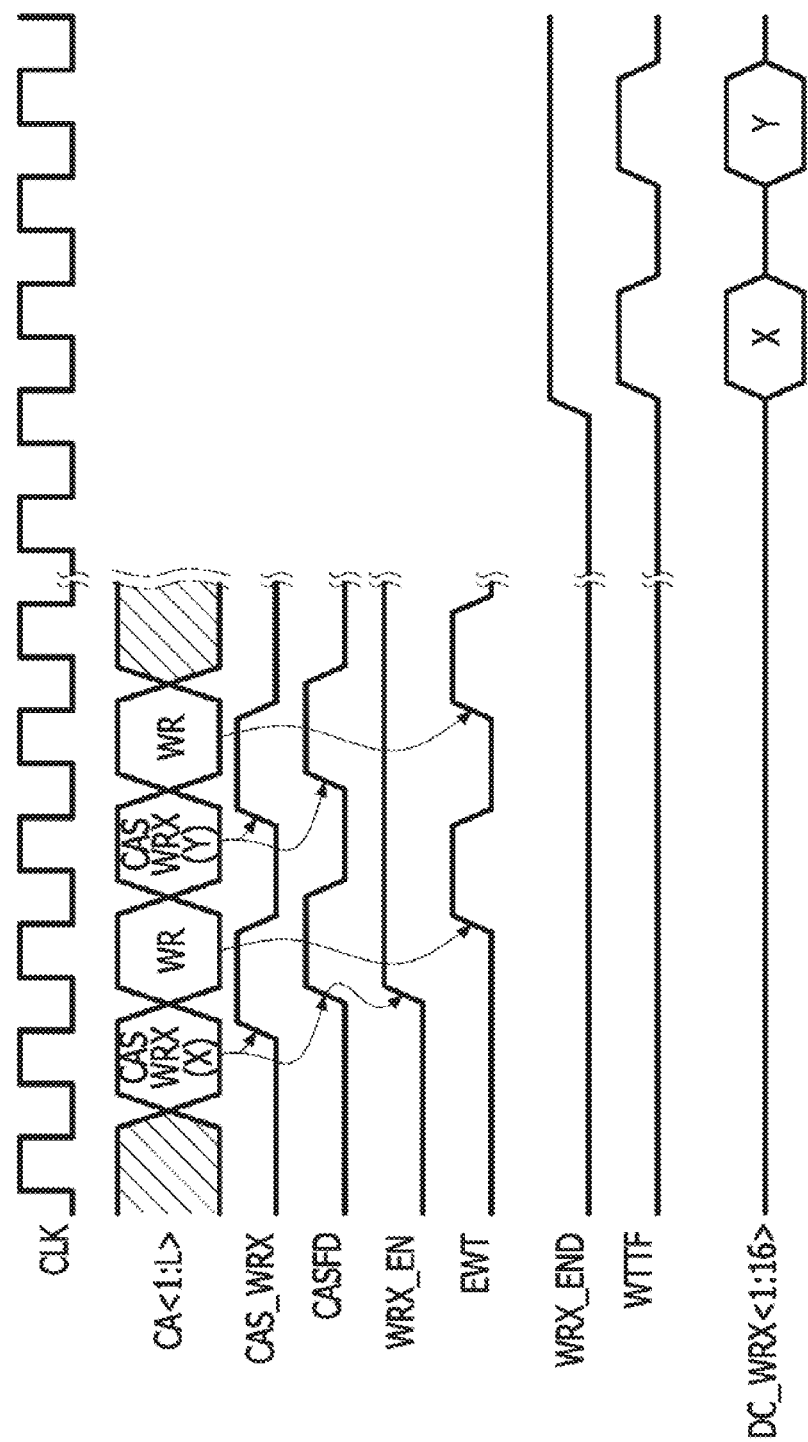
FIGS. 15 and 16 are timing diagrams illustrating operations of the semiconductor device illustrated in FIG. 1.
Figure 16:
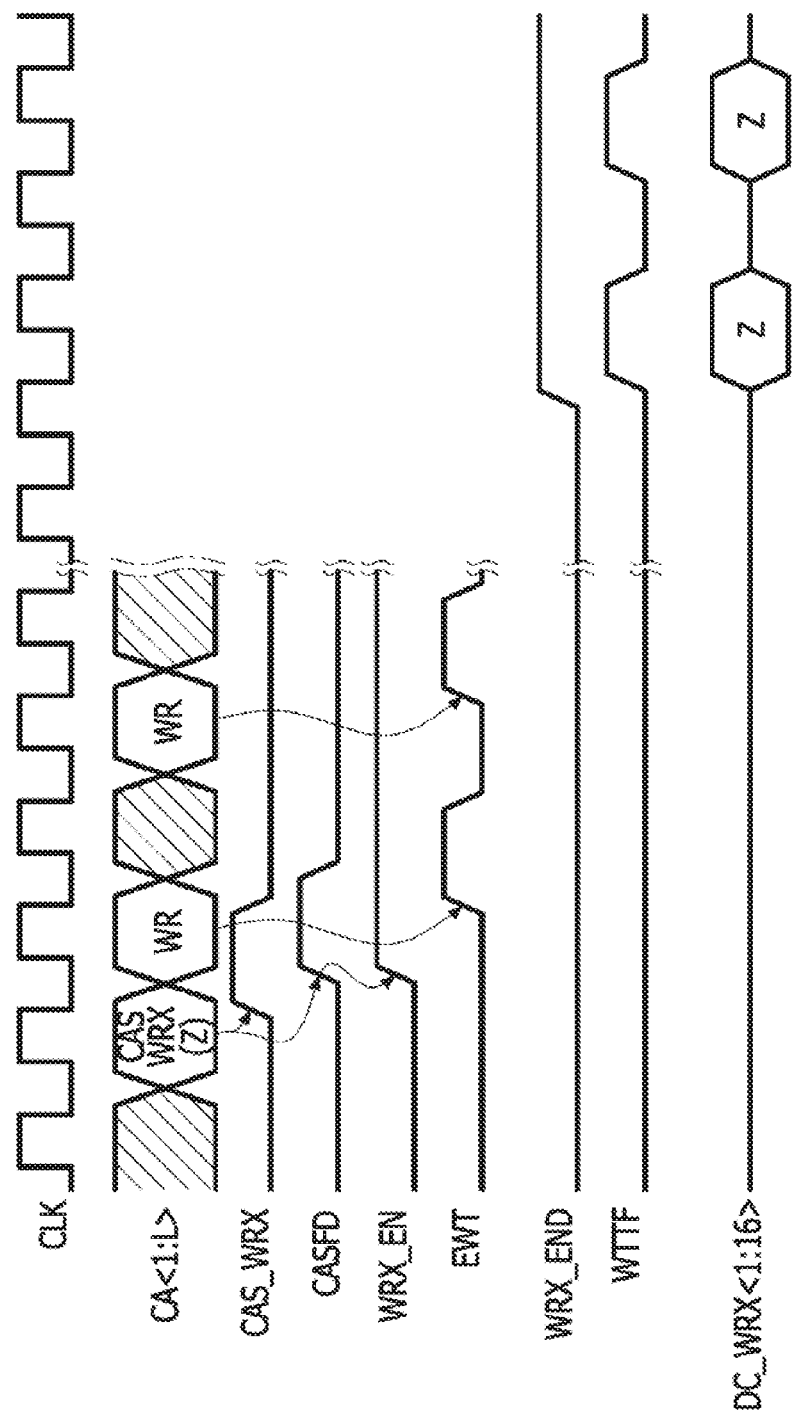

An operation of the semiconductor device 1 will be described hereinafter with reference to FIGS. 15 and 16. In FIGS. 15 and 16, the operation of the semiconductor device 1 is illustrated with respect to the clock signal CLK.

Referring to FIG. 15, the operation of the semiconductor device 1 may be described in conjunction with an example in which a first command for generating the mode signal CAS_WRX, the first to fourth pattern data DC<1:4> having a first logic level combination 'X', and a first write command WR are inputted to the semiconductor device 1 through the first to $L^{th}$ external signals CA<1:L>, thereafter a second command for generating the mode signal CAS_WRX, the first to fourth pattern data DC<1:4> having a second logic level combination and a second write command WR are inputted to the semiconductor device 1 through the first to $L^{th}$ external signals CA<1:L>.

As illustrated in FIG. 15, the mode signal CAS_WRX and the delayed mode command CASFD may be sequentially generated by the command for generating the mode signal CAS_WRX, and the mode output control signal WRX_EN may be enabled to have a logic "high" level in synchronization with a point of time that both of the mode signal CAS_WRX and the delayed mode command CASFD are generated. The write signal EWT may be generated by the write command WR. The delay mode output control signal WRX_END may be generated by delaying the mode output control signal WRX_EN by a delay time which is set according to the write latency, and the write flag WTTF may be generated by delaying the write signal EWT by the delay time which is set according to the write latency. The first to sixteenth mode data DC_WRX<1:16> may be outputted while the delay mode output control signal WRX_END is enabled to have a logic "high" level and the write flag WTTF is generated. The first to sixteenth mode data DC_WRX<1:16> outputted by the first write command WR may be generated by decoding the first to fourth pattern data DC<1:4> having the first logic level combination 'X', and the first to sixteenth mode data DC_WRX<1:16> outputted by the second write command WR may be generated by decoding the first to fourth pattern data DC<1:4> having the second logic level combination 'Y'.

As described above, the semiconductor device 1 according to an embodiment may receive and latch the pattern data DC<1:4> having a predetermined logic level combination before the write command WR is inputted to the semiconductor device 1 and may receive and latch the pattern data DC<1:4> having another predetermined logic level combination to perform a separate write operation during a period set by a write latency after the write command WR is inputted to the semiconductor device 1. That is, the semiconductor device 1 may perform a plurality of write operations for various logic level combinations of the pattern data.

For example, the latch data generation circuit (13 of FIG. 1) may generate latched data LC<1:4> having a first logic combination from pattern data DC<1:4> having the first logic combination when the semiconductor device 1 enters a first pattern input mode in which the pattern data DC<1:4> having the first logic combination are inputted. The column path circuit (15 of FIG. 1) may store the latched data LC<1:4> having the first logic combination into the pipe latch (63 of FIG. 8) of the column path circuit (15 of FIG. 1) when a first write command WR is inputted through the external signals CA<1:L> in the first pattern input mode. The latch data generation circuit (13 of FIG. 1) may generate latched data LC<1:4> having a second logic combination from pattern data DC<1:4> having the second logic combination when the semiconductor device 1 enters a second pattern input mode in which the pattern data DC<1:4> having the second logic combination are inputted during a period corresponding to the write latency after the first write command WR is inputted. The column path circuit (15 of FIG. 1) may output the latched data LC<1:4> having the first logic combination stored in the pipe latch (63 of FIG. 8) as first to fourth pipe data (PD<1:4> of FIG. 8) based on the first logic combination after a write latency elapses from a point of time that the first write command WR is inputted. The column path circuit (15 of FIG. 1) may then decode the first to fourth pipe data (PD<1:4> of FIG. 8) based on the first logic combination to generate the mode data DC_WRX<1:16> based on the first logic combination. After the latched data LC<1:4> having the second logic combination is generated by the latch data generation circuit (13 of FIG. 1), the column path circuit (15 of FIG. 1) may store the latched data LC<1:4> having the second logic combination into the pipe latch (63 of FIG. 8) of the column path circuit (15 of FIG. 1) when a second write command WR is inputted through the external signals CA<1:L>. The column path circuit (15 of FIG. 1) may output the latched data LC<1:4> having the second logic combination stored in the pipe latch (63 of FIG. 8) as first to fourth pipe data (PD<1:4> of FIG. 8) based on the second logic combination after a write latency elapses from a point of time that the second write command WR is inputted. The column path circuit (15 of FIG. 1) may then decode the first to fourth pipe data (PD<1:4> of FIG. 8) based on the second logic combination to generate the mode data DC_WRX<1:16> based on the second logic combination.

Referring to FIG. 16, the operation of the semiconductor device 1 may be described in conjunction with an example in which a command for generating the mode signal CAS_WRX, the first to fourth pattern data DC<1:4> having a third logic level combination 'Z', and a first write command WR are inputted to the semiconductor device 1 through the first to $L^{th}$ external signals CA<1:L>, thereafter a second write command WR is inputted to the semiconductor device 1 through the first to $L^{th}$ external signals CA<1:L> after the first write command WR is inputted.

As illustrated in FIG. 16, the mode signal CAS_WRX and the delayed mode command CASFD may be sequentially generated by the command for generating the mode signal CAS_WRX, and the mode output control signal WRX_EN may be enabled to have a logic "high" level in synchronization with a point of time that both of the mode signal CAS_WRX and the delayed mode command CASFD are generated. The write signal EWT may be generated by the write command WR. The delay mode output control signal WRX_END may be generated by delaying the mode output control signal WRX_EN by a delay time which is set according to the write latency, and the write flag WTTF may be generated by delaying the write signal EWT by the delay time which is set according to the write latency. The first to sixteenth mode data DC_WRX<1:16> may be outputted while the delay mode output control signal WRX_END is enabled to have a logic "high" level and the write flag WTTF is generated. The first to sixteenth mode data DC_WRX<1:16> outputted by the first write command WR may be generated by decoding the first to fourth pattern data DC<1:4> having the third logic level combination 'Z', and the first to sixteenth mode data DC_WRX<1:16> outputted by the second write command WR may also be generated by decoding the first to fourth pattern data DC<1:4> having the third logic level combination 'Z'.

As described above, the semiconductor device 1 according to an embodiment may receive and latch the pattern data DC<1:4> having a predetermined logic level combination before the write commands WR are inputted to the semiconductor device 1 and may sequentially receive the plurality of write commands WR after the pattern data DC<1:4> are latched. Thus, the semiconductor device 1 may perform a plurality of write operations corresponding to the pattern data DC<1:4> that are latched, even without receiving any additional pattern data. Accordingly, it may be possible to reduce power consumption of the semiconductor device 1.

For example, the latch data generation circuit (13 of FIG. 1) may generate latched data LC<1:4> having a first logic combination from pattern data DC<1:4> having the first logic combination when the semiconductor device 1 enters a first pattern input mode in which the pattern data DC<1:4> having the first logic combination are inputted. The column path circuit (15 of FIG. 1) may store the latched data LC<1:4> having the first logic combination into the pipe latch (63 of FIG. 8) of the column path circuit (15 of FIG. 1) when a first write command WR is inputted through the external signals CA<1:L> in the first pattern input mode. The column path circuit (15 of FIG. 1) may output the latched data LC<1:4> having the first logic combination stored in the pipe latch (63 of FIG. 8) as first to fourth pipe data (PD<1:4> of FIG. 8) after a write latency elapses from a point of time that the first write command WR is inputted. The column path circuit (15 of FIG. 1) may then decode the first to fourth pipe data (PD<1:4> of FIG. 8) to generate the mode data DC_WRX<1:16> based on the first logic combination. The column path circuit (15 of FIG. 1) may store the latched data LC<1:4> having the first logic combination into the pipe latch (63 of FIG. 8) of the column path circuit (15 of FIG. 1) when a second write command WR is inputted through the external signals CA<1:L> during a period corresponding to the write latency after the first write command WR is inputted. The column path circuit (15 of FIG. 1) may output the latched data LC<1:4> having the first logic combination stored in the pipe latch (63 of FIG. 8) as first to fourth pipe data (PD<1:4> of FIG. 8) after a write latency elapses from a point of time that the second write command WR is inputted. The column path circuit (15 of FIG. 1) may then decode the first to fourth pipe data (PD<1:4> of FIG. 8) to generate the mode data DC_WRX<1:16> based on the first logic combination for the second time.

Figure 17:
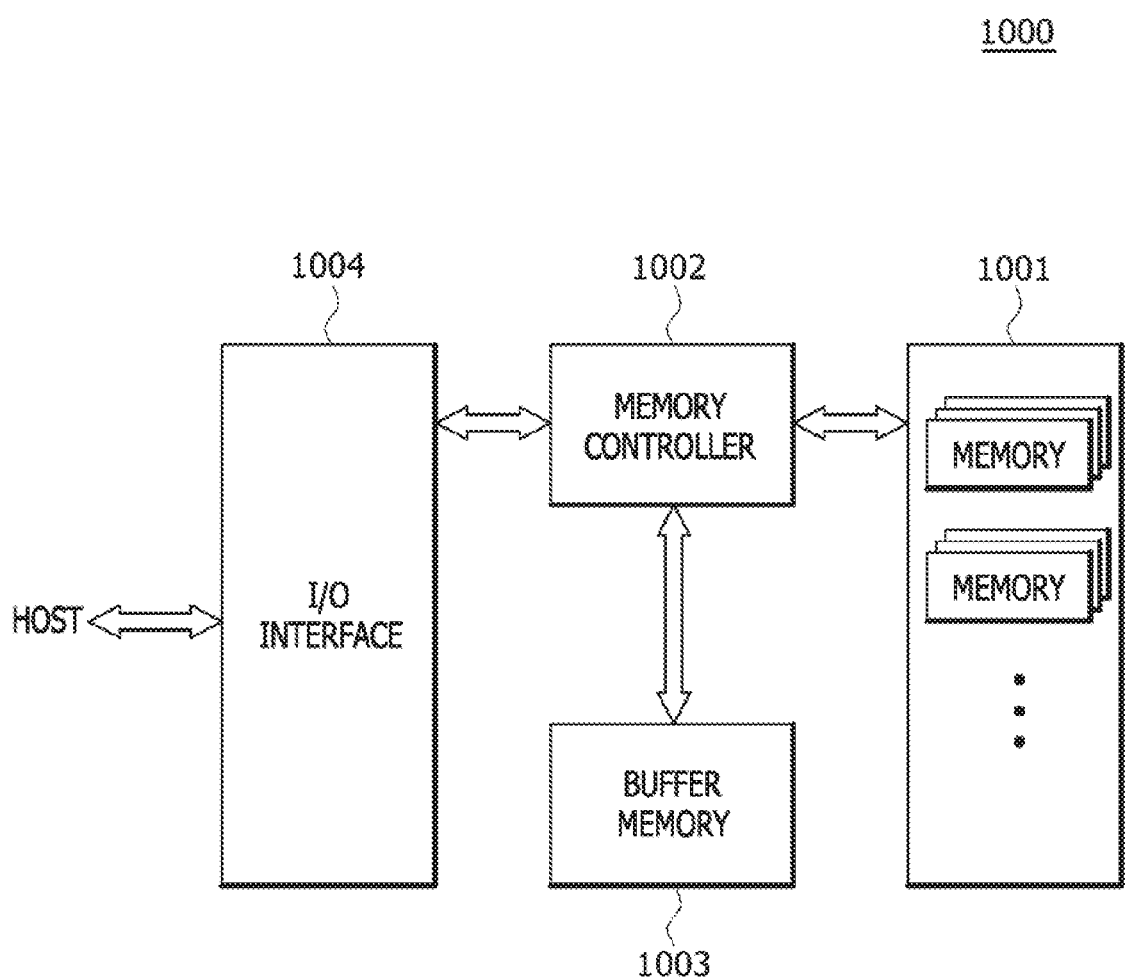
FIG. 17 is a block diagram illustrating a configuration of an electronic system employing the semiconductor device illustrated in FIG. 1.

The semiconductor device 1 described with reference to FIG. 1 may be applied to an electronic system that includes a memory system, a graphic system, a computing system, a mobile system, or the like. For example, as illustrated in FIG. 17, an electronic system 1000 according to an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the semiconductor device 1 illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 17 illustrates the memory controller 1002 with a single block, the memory controller 1002 may include one controller for controlling the data storage circuit 1001 and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
   a latch data generation circuit configured to extract pattern data from external signals and latch the pattern data to generate latched data when the semiconductor device enters a first pattern input mode; and
   a column path circuit configured to store the latched data when a write command is inputted in the first pattern input mode and configured to generate mode data from the latched data stored in the column path circuit after a write latency elapses from a point of time that the write command is inputted.

2. The semiconductor device of claim 1, wherein the latch data generation circuit is configured to latch the external signals in synchronization with an internal clock signal to extract the pattern data and is configured to latch the pattern data in synchronization with a delay mode signal to generate the latched data.

3. The semiconductor device of claim 2, wherein the delay mode signal is generated based on the external signals which are inputted in synchronization with the internal clock signal in the first pattern input mode.

4. The semiconductor device of claim 2, further comprising: a mode entry control circuit configured to generate a mode signal for putting the semiconductor device in the first pattern input mode from the external signals in response to a chip selection signal and the internal clock signal; and a mode signal delay circuit configured to delay the mode signal to generate the delay mode signal.

5. The semiconductor device of claim 1, wherein the column path circuit is configured to store the latched data in response to a delay mode signal and is configured to output the latched data, which are stored in the column path circuit, in response to a delay mode output control signal and a write flag.

6. The semiconductor device of claim 5, wherein the delay mode signal is generated in the first pattern input mode; and wherein the delay mode output control signal and the write flag are generated after the write latency elapses from the point of time that the write command is inputted.

7. The semiconductor device of claim 1, wherein the column path circuit includes: a pipe latch configured to store the latched data in response to a pipe input signal which is counted when a delay mode signal is generated and is configured to output the latched data stored in the pipe latch as pipe data in response to a pipe output signal which is counted when a delay mode output control signal and a write flag are generated; and a data decoder configured to decode the pipe data to generate the mode data.

8. The semiconductor device of claim 7, wherein the data decoder is configured to include a plurality of switches and is configured to generate the mode data from the pipe data which are selectively outputted from the plurality of switches in response to an option signal.

9. The semiconductor device of claim 8, wherein a logic level of the option signal is determined according to an electrical open/short state of a fuse included in the semiconductor device.

10. The semiconductor device of claim 1, wherein the latch data generation circuit enters a second pattern input mode during the write latency duration after the write command is inputted to generate the latched data from the external signals.

11. The semiconductor device of claim 1, wherein the column path circuit receives a write flag and a delay mode output control signal during the write latency duration after the write command is inputted to generate the mode data.

12. A semiconductor device comprising:
a latch data generation circuit configured to generate first latched data from first pattern data when the semiconductor device enters a first pattern input mode in which the first pattern data having a first logic level combination are inputted; and
a column path circuit configured to store the first latched data when a first write command is inputted in the first pattern input mode and configured to generate first mode data from the first latched data stored in the column path circuit after a write latency elapses from a point of time that the first write command is inputted.

13. The semiconductor device of claim 12, wherein the column path circuit is configured to store the first latched data when a second write command is inputted during a period corresponding to the write latency after the first write command is inputted and is configured to generate second mode data from the first latched data stored in the column path circuit after the write latency elapses from a point of time that the second write command is inputted.

14. The semiconductor device of claim 12, wherein the latch data generation circuit is configured to generate second latched data from second pattern data when the semiconductor device enters a second pattern input mode in which the second pattern data having a second logic level combination are inputted during a period corresponding to the write latency after the first write command is inputted.

15. The semiconductor device of claim 14, wherein the column path circuit is configured to store the second latched data when a second write command is inputted after the second latched data are generated and is configured to generate second mode data from the second latched data stored in the column path circuit after the write latency elapses from a point of time that the second write command is inputted.

16. The semiconductor device of claim 12, wherein the latch data generation circuit is configured to latch external signals in synchronization with an internal clock signal to generate the first pattern data and is configured to latch the first pattern data in synchronization with a delay mode signal to generate the first latched data.

17. The semiconductor device of claim 12, wherein the column path circuit is configured to store the first latched data in response to a delay mode signal and is configured to output the first latched data, which are stored in the column path circuit, in response to a delay mode output control signal and a write flag.

18. The semiconductor device of claim 12, wherein the column path circuit includes: a pipe latch configured to store the first latched data in response to a pipe input signal which is counted when a delay mode signal is generated and is configured to output the first latched data stored in the pipe latch as pipe data in response to a pipe output signal which is counted when a delay mode output control signal and a write flag are generated; and a data decoder configured to decode the pipe data to generate the first mode data.

19. The semiconductor device of claim 18, wherein the data decoder is configured to include a plurality of switches and is configured to generate the first mode data from the pipe data which are selectively outputted from the plurality of switches in response to an option signal.

20. The semiconductor device of claim 19, wherein a logic level of the option signal is determined according to an electrical open/short state of a fuse included in the semiconductor device.

21. A semiconductor device comprising:
a latch data generation circuit configured to extract pattern data from external signals and latch the pattern data to generate latched data when the semiconductor device enters a pattern input mode; and a column path circuit configured to store the latched data when a first write command is inputted in the pattern input mode and configured to generate first mode data from the latched data stored in the column path circuit after a write latency elapses from a point of time that the first write command is inputted, wherein the column path circuit stores the latched data when a second write command is inputted during a period corresponding to the write latency after the first write command is inputted and generates second mode data from the latched data stored in the column path circuit after the write latency elapses from a point of time that the second write command is inputted.

* * * * *